US012283316B2

(12) United States Patent
Tortorelli et al.

(10) Patent No.: US 12,283,316 B2
(45) Date of Patent: *Apr. 22, 2025

(54) CROSS-POINT PILLAR ARCHITECTURE FOR MEMORY ARRAYS

(71) Applicant: Micron Technology, Inc., Boise, ID (US)

(72) Inventors: Innocenzo Tortorelli, Cernusco Sul Naviglio (IT); Fabio Pellizzer, Boise, ID (US); Mattia Robustelli, Milan (IT); Alessandro Sebastiani, Piacenza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/409,992

(22) Filed: Jan. 11, 2024

(65) Prior Publication Data

US 2024/0221829 A1 Jul. 4, 2024

Related U.S. Application Data

(63) Continuation of application No. 17/647,578, filed on Jan. 10, 2022, now Pat. No. 11,887,661.

(60) Provisional application No. 63/266,155, filed on Dec. 29, 2021.

(51) Int. Cl.
*G11C 13/00* (2006.01)
(52) U.S. Cl.
CPC ........ *G11C 13/003* (2013.01); *G11C 13/0004* (2013.01); *G11C 13/0023* (2013.01); *G11C 13/004* (2013.01); *G11C 13/0069* (2013.01); *G11C 2213/71* (2013.01)

(58) Field of Classification Search
CPC .............. G11C 13/003; G11C 13/0004; G11C 13/0023; G11C 13/004; G11C 13/0069; G11C 2213/71; G11C 13/0061; G11C 2213/75; G11C 13/0007; G11C 13/0026; G11C 13/0028
USPC ......................................................... 365/163
See application file for complete search history.

(56) References Cited

U.S. PATENT DOCUMENTS

| 10,629,651 B2 | 4/2020 | Pellizzer |
| 11,887,661 B2* | 1/2024 | Tortorelli ........... G11C 13/0023 |
| 2020/0006432 A1 | 1/2020 | Grobis et al. |
| 2022/0246847 A1 | 8/2022 | Nugent et al. |
| 2023/0042262 A1 | 2/2023 | Choi et al. |

* cited by examiner

*Primary Examiner* — Huan Hoang
(74) *Attorney, Agent, or Firm* — Holland & Hart LLP

(57) ABSTRACT

Methods, systems, and devices for a cross-point pillar architecture for memory arrays are described. Multiple selector devices may be configured to access or activate a pillar within a memory array, where the selector devices may each be or include a chalcogenide material. A pillar access line may be coupled with multiple selector devices, where each selector device may correspond to a pillar associated with the pillar access line. Pillar access lines on top and bottom of the pillars of the memory array may be aligned in a square or rectangle formation, or in a hexagonal formation. Pillars and corresponding selector devices on top and bottom of the pillars may be located at overlapping portions of the pillar access lines, thereby forming a cross point architecture for pillar selection or activation. The selector devices may act in pairs to select or activate a pillar upon application of a respective selection voltage.

20 Claims, 11 Drawing Sheets

CROSS-POINT PILLAR ARCHITECTURE FOR MEMORY ARRAYS

CROSS REFERENCE

The present Application for Patent is a continuation of U.S. patent application Ser. No. 17/647,578 by TORTORELLI et al., entitled "CROSS-POINT PILLAR ARCHITECTURE FOR MEMORY ARRAYS" filed Jan. 10, 2022, which claims the benefit of U.S. Provisional Patent Application No. 63/266,155 by TORTORELLI et al., entitled "CROSS-POINT PILLAR ARCHITECTURE FOR MEMORY ARRAYS" filed Dec. 29, 2021, each of which is assigned to the assignee hereof and each of which is expressly incorporated by reference herein.

FIELD OF TECHNOLOGY

The following relates to one or more systems for memory, including a cross-point pillar architecture for memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

In some cases, a memory device may be configured with thin film transistors (TFTs) to selectively access pillars (e.g., bit lines or column lines) and associated memory cells within a memory array. Using a TFT to access or activate a pillar may, however, increase device complexity, such as during a programming operation in which multiple programming pulses may be applied to a memory cell based on using the TFT, where the multiple programming pulses may increase an amount of time and energy used to program a cell. Additionally or alternatively, fabricating TFTs to use as pillar selectors may increase manufacturing cost and complexity. A TFT may also limit current delivery to an associated pillar and memory cell. For example, a TFT may result in a low voltage spike when selecting a memory cell, which may reduce a read window for some memory cells with higher voltage thresholds. And in some cases, a TFT may also leak voltage at some voltage levels, such as voltage levels associated with accessing a memory cell using a pillar architecture.

As described herein, multiple selector devices (e.g., one on a top and one on a bottom of a corresponding pillar) may be used to access or activate a pillar, which may reduce cost, reduce manufacturing and operation complexity (e.g., result in using one programming pulse), or support delivery of higher currents and voltages than a TFT, among other potential benefits. The multiple selector devices for a pillar may each be or include a chalcogenide material, which may support current flow and voltage application after a threshold voltage is reached or exceeded across the respective selector device. A pillar access line may be coupled with multiple selector devices (e.g., one selector device for each pillar associated with the pillar access line). Pillar access lines on top and bottom of the pillars of the memory array may be aligned in a square or rectangle formation, or in a hexagonal formation. Pillars and corresponding selector devices (e.g., one top and one bottom selector device) may be located at overlapping portions of the pillar access lines, thereby forming a cross point architecture for pillar selection or activation. The selector devices may act in pairs to select or activate a pillar upon application of a respective selection voltage.

Features of the disclosure are initially described in the context of memory systems, dies, and arrays as described with reference to FIGS. 1-3. Features of the disclosure are described in the context of access operations and timing diagrams as described with reference to FIGS. 4-9. These and other features of the disclosure are further illustrated by and described with reference to an apparatus diagram and flowcharts that relate to cross-point pillar architecture for memory arrays as described with references to FIGS. 10 and 11.

Figure 1:
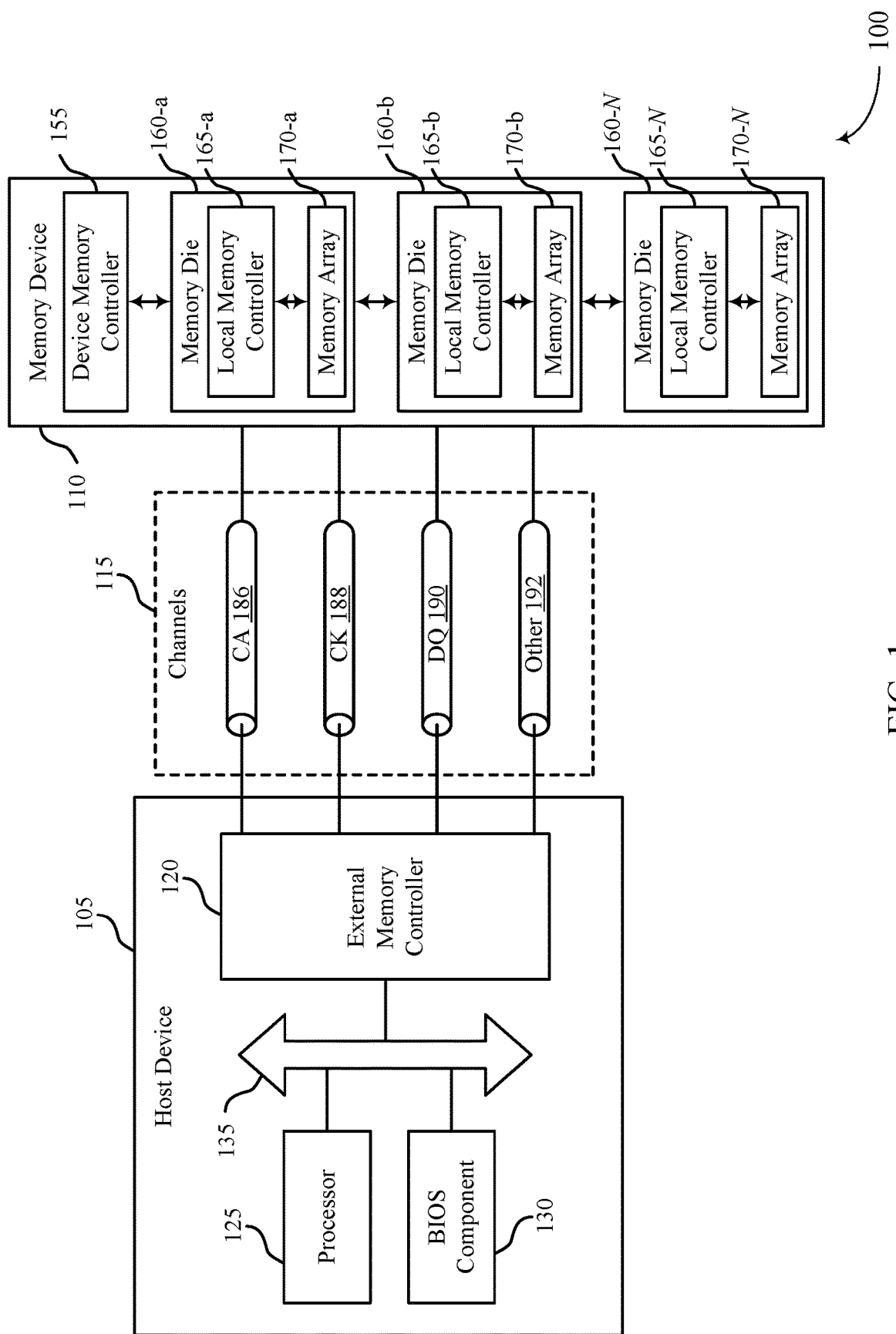
FIG. 1 illustrates an example of a system that supports a cross-point pillar architecture for memory arrays in accordance with examples as disclosed herein.

FIG. 1 illustrates an example of a system 100 that supports a cross-point pillar architecture for memory arrays in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 a, memory die 160 b, memory die 160 N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line. For example, as described herein, different decks may share a same pillar for accessing corresponding memory cells.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device. In response to a respective command, the memory device 110 may write data to one or more memory cells (e.g., in response to a write command) or may read data from one or more memory cells (e.g., in response to a read command).

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any quantity of signal paths to decode one or more of address or command data (e.g., eight or nine signal paths). In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

Figure 2:
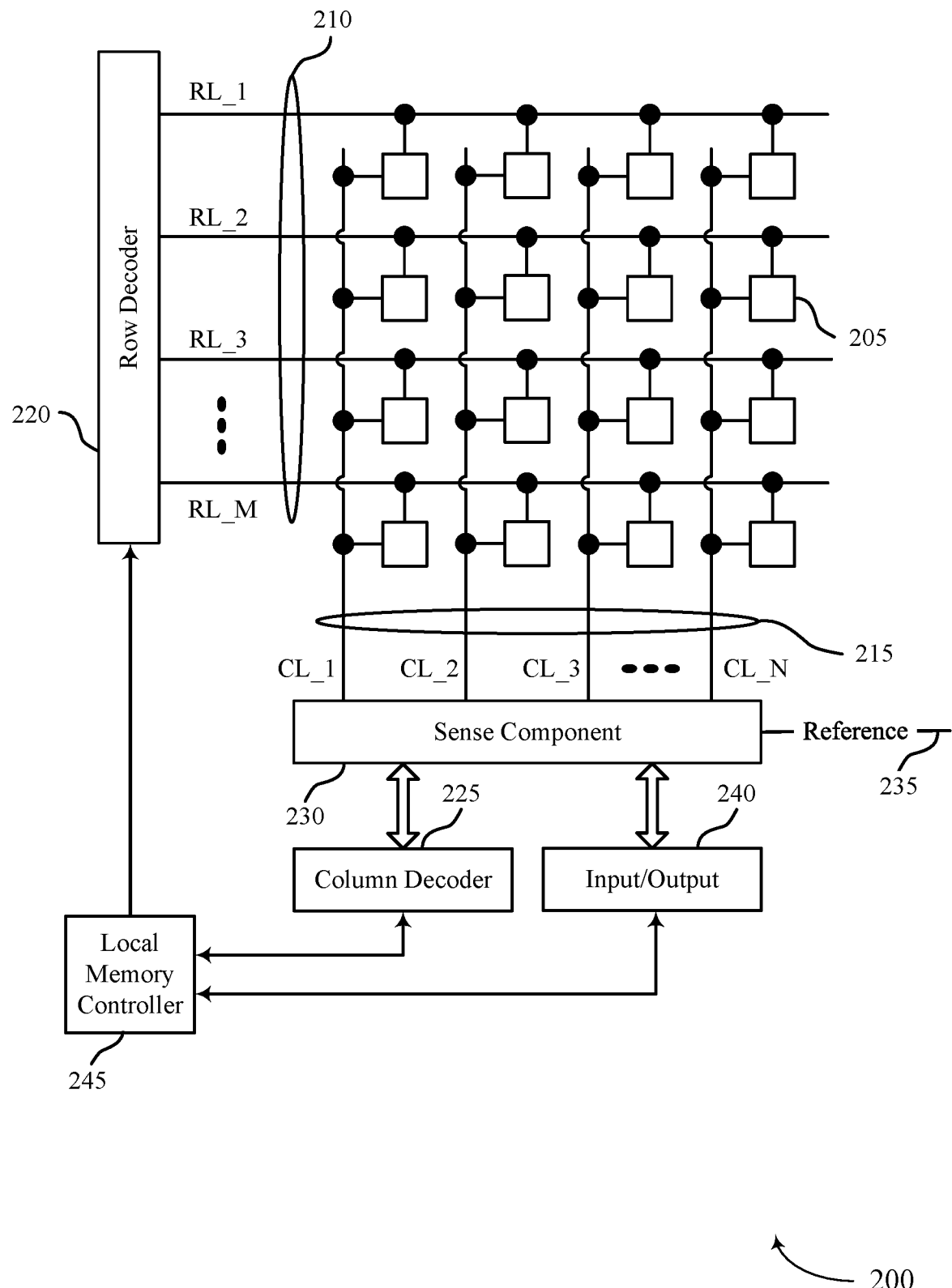
FIG. 2 illustrates an example of a memory die that supports a cross-point pillar architecture for memory arrays in accordance with examples as disclosed herein.

FIG. 2 illustrates an example of a memory die 200 that supports a cross-point pillar architecture for memory arrays in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

FIG. 2 may illustrate various features related to the electrical operation of a memory array, but the physical location and configuration of components may deviate from the depiction in FIG. 2. For example, the features illustrated by FIG. 2 may be representative of memory cells 205 being located at an intersection of respective access lines (e.g., row lines 210 and column lines 215), may be representative of electrical function of memory cells and other array components, or both, but a memory array may in some cases have a different physical architecture or structure relative to that illustrated by FIG. 2 (e.g., as described with reference to FIGS. 3-9).

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

In some cases, one or more column lines 215 (e.g., a column line CL_i) may run perpendicularly to a substrate and one or more row lines 210 (e.g., a row line RL_i) may be on a different deck than illustrated (e.g., each row line 210 may be a word line, or a word line finger of a word line plate, stacked in a vertical direction). In such cases, a memory cell 205 may be formed at an intersection of the column line CL_i and the row line RL_i (e.g., between a pillar and a word line). One or more other memory cells 205 may be coupled between one or more other row lines 210 (not pictured in FIG. 2) of one or more other stacked word lines (not pictured in FIG. 2) and the column line CL_i as well as between one or more other row lines 210 (not pictured in FIG. 2) and one or more other column lines 215 (e.g., pillars, not depicted).

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 (e.g., word line) based on the received row address. A column decoder 225 may receive a column address from the local memory controller 245 and may activate a column line 215 (e.g., pillar) based on the received column address. In some cases, as described herein a column decoder 225 may include or represent multiple decoders used to activate a column line 215 (e.g., a pillar). For example, a column decoder 225 may include or represent a first decoder for activating a first access line coupled with a first end of a pillar and may also include or represent a second decoder for activating a second access line coupled with a second end of the pillar.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage or current). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230) may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200. During a write operation, a memory cell 205 of the memory die 200 may be programmed to store a desired logic state. The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The local memory controller 245 may apply a specific signal (e.g., write pulse) to the column line 215 during the write operation to store a specific state in the storage element of the memory cell 205. The pulse used as part of the write operation may include one or more voltage levels over a duration.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference 235. Based on that comparison, the sense component 230 may determine a logic state that is stored on the memory cell 205. The pulse used as part of the read operation may include one or more voltage levels over a duration.

Multiple selector devices may be used to access or activate a pillar, where the selector devices may each be or include a chalcogenide material. A pillar access line may be coupled with multiple selector devices (e.g., one selector device for each pillar associated with the pillar access line). Pillar access lines on top and bottom of the pillars of the memory array may be aligned in a square or rectangle formation, or in a hexagonal formation. Pillars and corresponding selector devices (e.g., one top and one bottom selector device) may be located at overlapping portions of the pillar access lines, thereby forming a cross point architecture for pillar selection or activation. The selector devices may act in pairs to select or activate a pillar upon application of a respective selection voltage.

Figure 3:
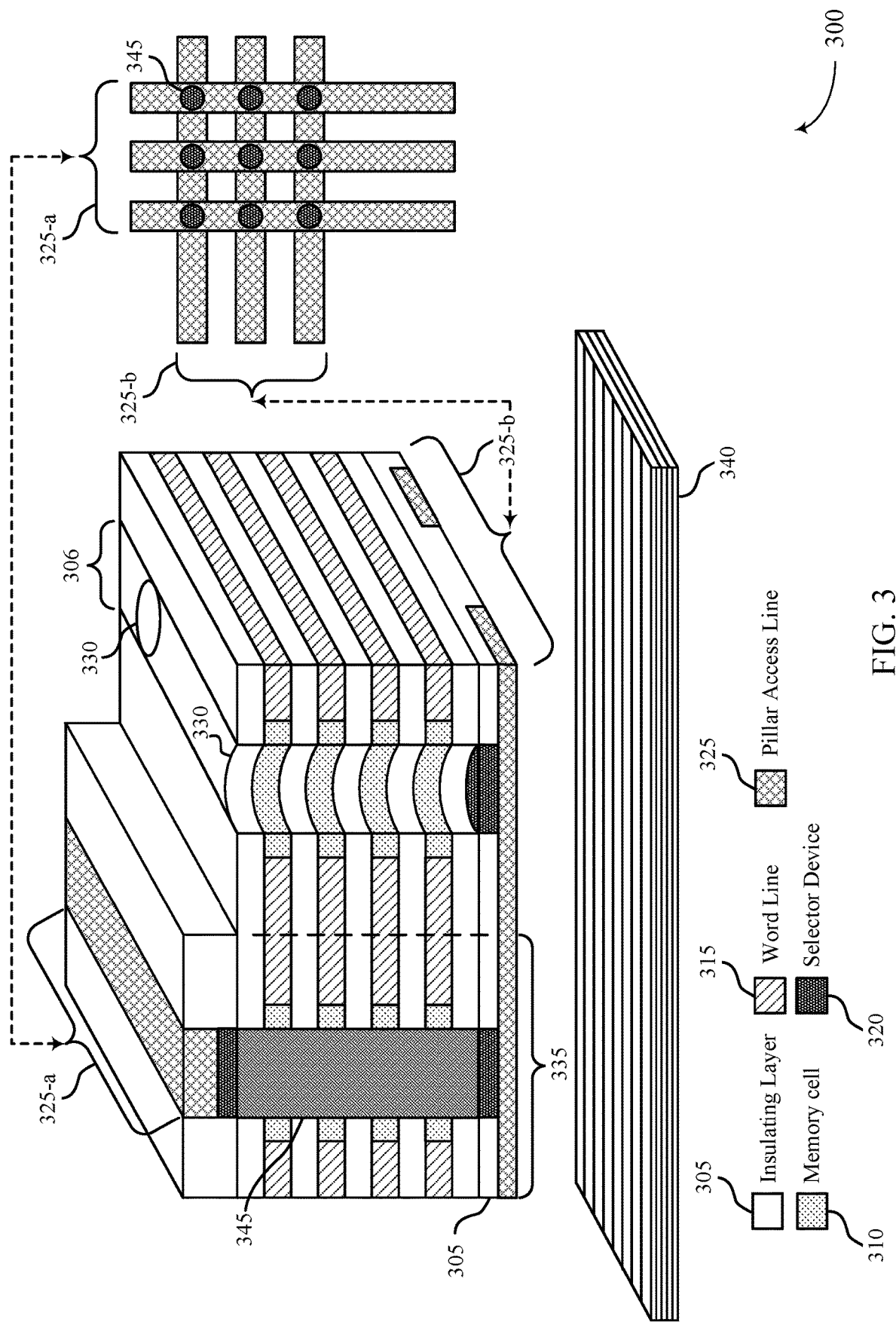
FIG. 3 illustrates an example of a memory array that supports a cross-point pillar architecture for memory arrays in accordance with examples as disclosed herein.

FIG. 3 illustrates an example of a memory array 300 in accordance with examples as disclosed herein. Memory array 300 may be included in a memory device and may be an example of portions of the memory arrays or memory dies described with reference to FIGS. 1 and 2. Memory array 300 may include multiple levels of memory cells 310 stacked in a vertical direction, relative to a substrate 340, to create memory cell stacks 335, which may be examples of a memory cell and memory cell stack as described with reference to FIGS. 1 and 2. Memory array 300 may thus be referred to, in some examples, as a 3D memory array. Memory array 300 may include word lines 315 and pillars 345, which may be examples of word lines and bit lines (e.g., row lines 210) and column lines 215) as described with reference to FIG. 2.

In some cases, an architecture of a memory device may use TFTs to selectively access pillars 345 (and associated memory cells 310) within a memory array. Using a TFT to access or activate a pillar 345 may increase complexity, such as during a programming operation in which multiple programming pulses may be applied to a memory cell 310 based on using the TFT, where the multiple programming pulses may increase an amount of time and energy used to program a cell. Fabricating TFTs to use as pillar selectors may also increase manufacturing cost and complexity, for example, based on fabricating the TFTs on top of or above a complimentary metal oxide semiconductor (CMOS) layer of the memory device. A TFT may also limit current delivery to an associated pillar 345 and memory cell 310. In some cases, a TFT may also leak voltage at some voltage levels, such as voltage levels associated with accessing a memory cell 310 using a pillar architecture. Additionally, a TFT may result in a low voltage spike when selecting a memory cell 310, which may reduce a read window for some memory cells 310 with higher voltage thresholds.

The present disclosure provides techniques for using multiple selector devices 320 (e.g., one on a top and one on a bottom of a corresponding pillar 345) to access or activate a pillar 345, which may reduce cost, reduce manufacturing and operation complexity (e.g., result in using one programming pulse), and may support delivery of higher currents and voltages than a TFT. The selector devices 320 may each be or include a chalcogenide material, which may support current flow and voltage application after a threshold voltage is reached or exceeded across the respective selector device 320. A pillar access line 325 may be coupled with multiple selector devices 320 (e.g., one selector device 320 for each pillar 345 associated with the pillar access line 325). Pillar access lines 325 on top and bottom of the pillars 345 of the memory array 300 may be aligned in a square or rectangle formation (e.g., as illustrated in the top view at the right of FIG. 3.), or in a hexagonal formation. Pillars 345 and corresponding selector devices 320 (e.g., one top and one bottom selector device 320) may be located at overlapping portions of the pillar access lines 325, thereby forming a cross point architecture for pillar selection or activation. The selector devices 320 may act in pairs to select or activate a pillar 345, instead of using a single TFT to select a pillar 345.

Each pillar 345 may be selectively couplable with two pillar access lines 325 via two respective selector devices 320. For example, a pillar access column line 325-*a* (e.g., a top access line 325-*a*) for a pillar 345 may be coupled with a corresponding selector device 320, which selector device 320 may be coupled with a first end (e.g., a top) of the pillar 345. Similarly, a pillar access row line 325-*b* (e.g., a bottom access line 325-*b*) for the pillar 345 may be coupled with a corresponding selector device 320, which selector device 320 may be coupled with a second end (e.g., a bottom) of the pillar 345. In some cases, the pillar access lines 325 may be a copper or tungsten material, or alloy thereof, among other examples.

Based on a voltage applied to the pillar access lines 325 (e.g., based on a voltage difference between a voltage applied to the pillar access column line 325-*a* and a voltage applied to the pillar access row line 325-*b*), the corresponding selector devices 320 may be selectively activated or deactivated (e.g., may snap). When activated (e.g., on, closed, conducting), the selector devices 320 for a pillar 345 may couple the pillar 345 with the pillar access lines 325 for the pillar 345, and thus the voltage of the pillar 345 may become equal or approximately equal to the voltage of the pillar access row line 325-*b* minus a voltage drop across the bottom selector device 320, or the voltage of the pillar access column line 325-*a* minus a voltage drop across the top selector device 320. A first pillar decoder may be operable to selectively activate (e.g., apply a selection voltage) or deactivate (e.g., apply a deselection voltage, or remove the selection voltage) a pillar column access line 325-*a* out of a set of pillar column access lines 325-*a* associated with the first pillar decoder. Similarly, a second pillar decoder may be operable to selectively activate (e.g., apply a selection voltage) or deactivate (e.g., apply a deselection voltage, or remove the selection voltage) a pillar access row line 325-*b* out of a set of pillar access row lines 325-*b* associated with the second pillar decoder.

Pillar access column lines 325-*a* and pillar access row lines 325-*b* may span and thus be coupled with the selector devices 320 corresponding to rows or columns of pillars 345 within a single word line plate, single word line tile, multiple word line plates, or multiple word line tiles. One of ordinary skill in the art will appreciate that a direction (e.g., the X or Y direction) considered to be a row versus a column may be arbitrary. Similarly, an end of a pillar 345 considered to be a first end or a second end of a pillar 345 (e.g., top or bottom of the pillar 345) may be arbitrary. While the example of FIG. 3 illustrates pillar access row lines 325-*b* as below the pillars 345 and pillar access column lines 325-*a* as above the pillars 345, pillar access row lines 325-*b* may alternatively be above the pillars 345 and pillar access column lines 325-*a* may alternatively be below the pillars 345 in some implementations.

In some cases, a pillar 345 may correspond (e.g., in terms of one or more functionalities) to a column line 215 as described with reference to FIG. 2. Similarly, pillar decoders, pillar access column lines 325-*a*, pillar access row lines 325-*b*, and corresponding selector devices 320, may correspond (e.g., in terms of one or more functionalities) to one or more aspects of a column decoder 225 as described with reference to FIG. 2.

A word line plate may include multiple word lines 315 in a "comb" structure (e.g., a structure that may look like a tool with fingers and a space between each pair of adjoining fingers), among other examples. The word line plate may, for example, include a sheet of conductive material that includes a first portion extending in a first direction within a plane, and multiple fingers extending in a second direction within the plane. Each finger of the word line plate may represent a word line 315 as described herein. A quantity of fingers (e.g., word lines) and a length of the fingers may define a size of a word line plate, where the size of the word line plate may be based on a capacitance of the word line plate in relation to one or more storage class memory (SCM) specifications.

In some cases, pillars 345 coupled with a same pillar access column line 325-*a* may be considered as a comb structure with vertical comb fingers (e.g., the pillars 345) that are selectable (e.g., individually relative to other pillars 345 coupled with the same pillar access column line 325-*a*) via respective pillar access row lines 325-*b*, or vice versa. Each memory cell 310 may be located at the intersection of a horizontal finger of a word line 315 and a vertical finger (e.g., a pillar 345, which may be considered a digit line or a portion of a digit line), though the teachings herein are not limited to such conceptualizations.

Memory array 300 may also include insulating layers 305. Insulating layers 305 may be electrically insulating and may provide insulation between alternating layers of word lines 315, among other portions of the memory array 300. Insulating layers 305 may be composed of multiple sublayers, creating one or more interfaces between memory cells 310.

Memory array 300 may include an array of memory cell stacks 335, and each memory cell stack 335 may include multiple memory cells 310. Memory array 300 may be made by forming a stack of conductive layers (e.g., first electrodes), such as word lines 315, where each conductive layer may be separated from an adjacent conductive layer by one or more electrically insulating layers 305. The electrically insulating layers may include oxide or nitride materials, such as silicon oxide, silicon nitride, or other electrically insulating materials. In some cases, electrically insulating layers 305 may include one or more sublayers. The layers of memory array 300 may be formed on a substrate 340, such as a silicon wafer, or any other semiconductor or oxide substrate. Vias 330 (e.g., openings) may be formed by removing material from the stack of layers through etching or mechanical techniques, or both.

Memory cells 310 (e.g., memory elements) may in some cases be formed by removing material from the conductive layer to create a recess adjacent to a via 330, and forming a variable resistance material in the recess. For example, material may be removed from the conductive layer by etching, and the variable resistance material may be deposited in the resulting recess to form a memory cell 310 (e.g., memory material element, which may be a storage element). Each via 330 may be filled with electrical conductor materials to create a pillar 345, which may be coupled (e.g., selectively, such as using selector devices 320) to corresponding pillar access lines 325. In other words, memory cells 310 in a memory cell stack 335 may share a common electrode (e.g., a pillar 345). Thus, each memory cell 310 may be coupled with a word line 315 and a pillar 345.

In some cases, each pillar 345 (e.g., within each via 330) may be coupled with a first word line 315 via corresponding first memory cells 310 and a second word line 315 via corresponding second memory cells 310. Trench insulating layers 306 may be aligned with a column of pillars 345 (e.g., may extend in a same direction as pillar access column lines 325-*a*) and may be electrically insulating, thereby providing insulation between alternating (e.g., interdigited) word lines 315 (e.g., word line fingers on each side of a via 330 in the direction of the pillar access column lines 325-*a*, where word line fingers on opposite sides of a trench insulating layer 306 may extend in parallel but opposite directions away from the spines of their respective word line plates, such as with a first word line finger immediately on one side of the trench insulating layer 306 extending to out of the page and a second word line finger immediately on the opposite side of the trench insulating layer 306 extending to into the page). In the example of FIG. 3, only a top surface of a trench insulating layer 306 is shown, but it is to be understood that this trench insulating layer 306 may extend vertically through each of the insulating layers 305 and word line 315 layers thereunder, to separate and provide insulation between the word line 315 fingers on either side of the trench insulating layer 306.

In some examples, a material of the memory cells 310 (e.g., memory elements) may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In), or a combination thereof, and such chalcogenide materials may be referred to as SiSAGalloy or InSAG-alloy, respectively, or a combination thereof. In some examples, the chalcogenide glass may include additional elements such as hydrogen (H), oxygen (O), nitrogen (N), chlorine (CI), or fluorine (F), each in atomic or molecular forms. Other chalcogenide alloys not expressly recited here may also be employed.

As described herein, various logic states may be stored by programming the electrical resistance of memory cells 310. In some cases, programming the electrical resistance includes passing a current through memory cell 310, heating memory cell 310, melting the material of memory cell 310 (e.g., wholly or partially), applying a voltage of a particular polarity to the memory cell, or any combination thereof.

Phase change memory cells (e.g., made of one or more chalcogenide materials described herein) may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., memory cells 310), the various parameters of the programming pulse may influence (e.g., determine, set, program) a particular behavior or characteristic of the material of the memory cell 310, such as the threshold voltage of the material or the resistance of the material. To program a low-resistance state (e.g., a relatively crystalline state) in the phase change memory cell, a programming pulse may be applied that heats or melts the material of a storage element of the memory cell 310, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state.

To program a high-resistance state (e.g., a relatively amorphous state) in the phase change memory cell, a programming pulse may be applied that heats and/or melts the material of the storage element. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element depending on the logic state stored by the material of the storage element may correspond to the read window of the storage element. In some cases, a portion of a storage element may undergo a material change associated with the logic states.

In some examples, such as for thresholding memory cells or self-selecting memory cells 310, some or all of a set of logic states supported by the memory cells 310 may be associated with a same state, such as an amorphous state of the chalcogenide material as opposed to a crystalline state of the chalcogenide material (e.g., the material may be operable to store different or multiple logic states while remaining in an amorphous state). In some such examples, a memory cell 310 may be an example of a self-selecting memory cell 310. In such examples, the material used in the memory cell 310 may be based on an alloy (such as the alloys listed above) and may be operated so as to undergo a state change during normal operation of the memory cell (e.g., due to ion migration or segregation within the memory cell 310). For example, a self-selecting memory cell 310 may have a high threshold voltage state and a low threshold voltage state. A high threshold voltage state may correspond to a first logic state (e.g., a reset state) and a low threshold voltage state may correspond to a second logic state (e.g., a set state). In some examples, a memory cell 310 may alternatively be switched between an amorphous and crystalline state during operation, which the amorphous and crystalline states corresponding to different resistances or threshold voltages and thus to different logic states, and such operation may in some cases be referred to as phase change operation.

In some cases, during a programming (write) operation of a self-selecting memory cell 310, a polarity of one or more pulses used for a write operation may influence (determine, set, program) a particular behavior or characteristic of the material of the memory cell 310, such as the threshold voltage of the material. The difference in threshold voltages of the material of the memory cell 310 depending on the logic state stored by the material of the memory cell 310 (e.g., the difference between the threshold voltage when the material is storing a logic state '0' versus a logic state '1') may correspond to a read window of the memory cell 310.

Various techniques may be used to form materials or components on a substrate 340. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a variety of techniques, which may include, for example, chemical etching (also referred to as "wet etching"), plasma etching (also referred to as "dry etching"), or chemical-mechanical planarization.

As described herein, regions separating memory cells 310, for example, insulating layers 305, trench insulating layers 306, or both, may include one or more interfaces. In some examples, the interfaces of the insulating layers 305 separate memory cells 310 stacked in the vertical direction. In other words, memory cells 310 may be stacked one on top of the other and separated from one another by the interfaces. In some examples, the interfaces of the trench insulating layers 306 separate word line fingers from one another in a horizontal plane.

The memory cells 310 described herein may include, but not be limited to, phase change materials. Other types of memory cells 310 may include, for example, resistive memory or resistive RAM. In some cases, resistive RAM may use metal oxide materials whose electrical resistance is varied by controlling the ionic state of atoms in the material or by controlling the quantity or location of atomic vacancies (e.g., missing atoms) in the material.

As described herein, one or more access operations may be performed on a pillar 345 to access a memory cell 310 coupled with the pillar 345. The pillar 345 may be accessed or selected by applying voltages along the pillar access lines 325, and therefore to the selector devices 320, coupled with the pillar 345. For example, a first selection voltage may be applied to a pillar access column line 325-*a*, and through the pillar access column line 325-*a* to a top selector device 320 coupled with the pillar 345. Similarly, a second selection voltage (e.g., opposite in polarity to the first selection voltage) may be applied to a pillar access row line 325-*b*, and through the pillar access row line 325-*b* to a bottom selector device 320 coupled with the pillar 345.

If a voltage difference between the top and bottom selector devices 320 is higher than a voltage threshold for the selector devices 320, the selector devices 320 may "snap" and select or access the shared pillar 345. Such voltage applications may occur concurrently, or close to concurrently, for both selector devices 320 to select and access the pillar 345. The pillar access column line 325-*a* and the pillar access row line 325-*b* may apply the respective selection voltages to a corresponding set of selector devices 320 coupled with the pillar 345. Based on the cross-point pillar architecture of memory array 300, the selected pillar 345 (e.g., the shared pillar 345) may have voltages applied to both top and bottom selector devices 320, and thus may be selected or activated.

When reading or programming a memory cell 310 coupled with the pillar 345, after selecting the pillar 345, a word line 315 coupled with the memory cell 310 may be activated to access the memory cell 310 (e.g., a first voltage may be applied to the word line 315). Similarly, after selecting the pillar 345, a second voltage (e.g., opposite in polarity to the first voltage) may be applied to either the pillar access column line 325-*a* or the pillar access row line 325-*b*, and the selection voltages may be removed from both pillar access lines 325. Based on applying the voltages to the word line 315 and the respective pillar access line 325, a voltage difference may be applied across the memory cell 310 (e.g., via the respective pillar access line 325 and the pillar 345, and via the word line 315 coupled with the memory cell 310).

In an example of performing positive programming or a positive read on the memory cell 310, the second voltage may be applied to the pillar access column line 325-*a*, and the second voltage may be higher than the first voltage applied to the word line 315 (e.g., the second voltage may have a positive polarity and the first voltage may have a negative polarity). In an example of performing negative programming or a negative read on the memory cell 310, the second voltage may be applied to the pillar access row line 325-*b*, and the second voltage may be lower than the first voltage applied to the word line 315 (e.g., the second voltage may have a negative polarity and the first voltage may have a positive polarity). In either positive or negative programming, a current may flow from the top to the bottom of the pillar 345. This may prevent some side effects during pillar selection and support a respective unipolar driver for the top pillar access line 325 and the bottom pillar access line 325.

In the examples described herein, using selector devices 320 to select or activate a pillar 345 may support increased flexibility for tuning the top and bottom selector devices 320, which may result in fewer process constraints, fewer electrical constraints, and a smaller window for access operations (e.g., a faster access operation time). Similarly, using the top and bottom selector devices 320 may reduce a complexity of a decoding scheme for accessing the memory cells 310, because the top and bottom pillar access lines 325 may operate with unipolar decoding (e.g., bipolar decoding may be used by the word lines 315). Additionally, such techniques may support simplified access algorithms (e.g., access algorithms with one voltage application to a memory cell 310), for example, based on a lack of leakage when increasing the selection voltages supplied to the pillar access lines 325.

Figure 4:
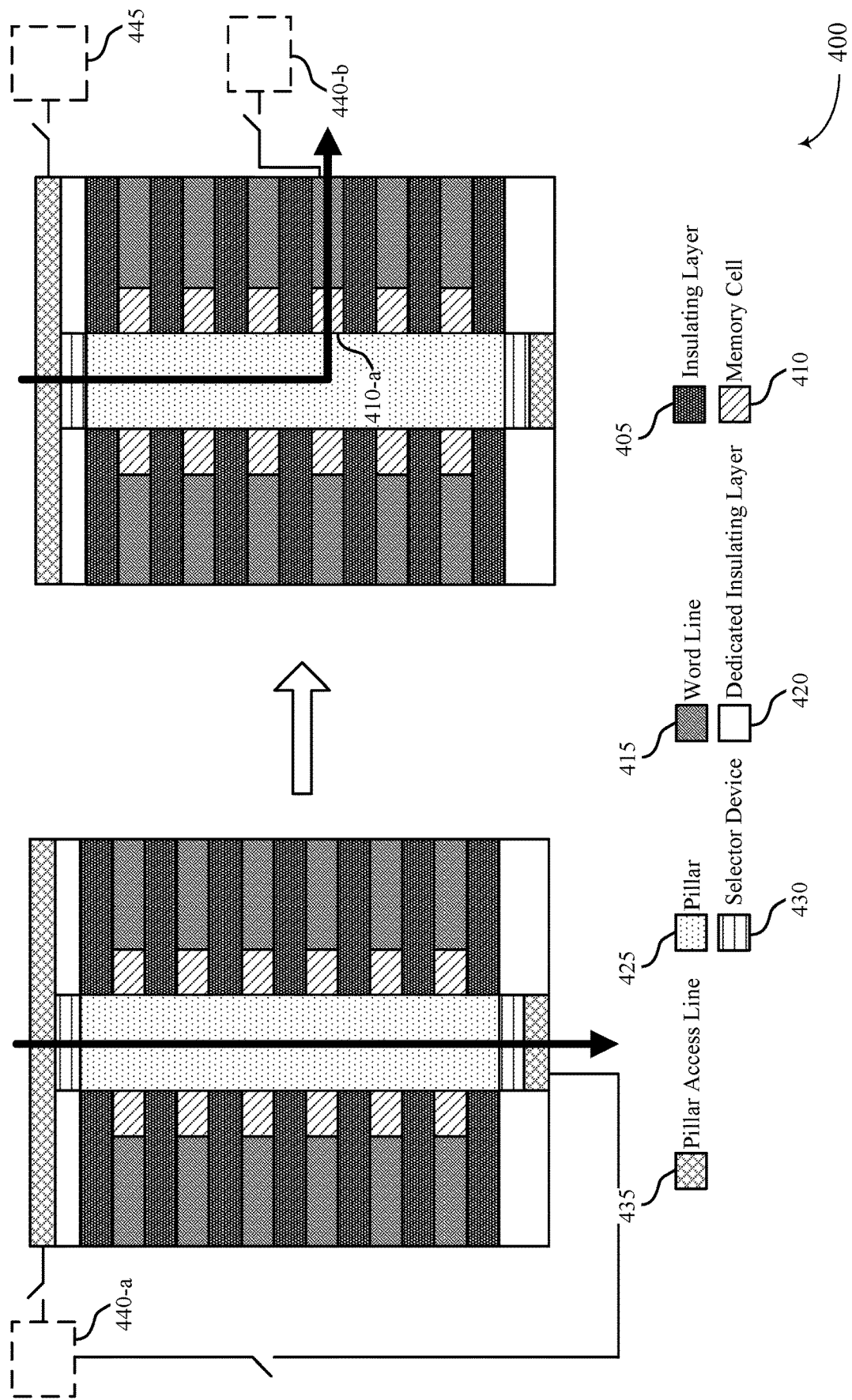
FIG. 4 illustrates an example of an access operation that supports a cross-point pillar architecture for memory arrays in accordance with examples as disclosed herein.

FIG. 4 illustrates an example of an access operation 400 that supports a cross-point pillar architecture for memory arrays in accordance with examples as disclosed herein. The access operation 400 may illustrate an example of a positive programming operation or a positive read operation, among other examples. The access operation 400 may represent an operation that performs pillar selection or activation to access an associated memory cell 410 using two selector devices 430, a pillar 425, and a word line 415, which components may represent examples of a memory cell, selector devices, a pillar, and a word line as described with reference to FIG. 3. The pillar architecture depicted in access operation 400 may be a cross-section side view of a pillar 425, such as with respect to memory array 300.

The pillar 425 may be coupled with two selector devices 430, which may each be coupled with a respective pillar access line 435. The pillar access lines 435 may be insulated or electrically isolated from other pillar access lines 435 by a dedicated insulating layer 420. Multiple memory cells 410 may be coupled with the pillar 425, and each memory cell 410 may be coupled with a respective word line 415. Word lines 415 and memory cells 410 may be stacked on top of each other in different layers, which layers may be electrically isolated or insulated from each other by intervening insulating layers 405.

A pillar 425 may be selected or activated by applying a respective selection voltage to each selector device 430 coupled with the pillar 425 (e.g., via pillar access lines 435), for example, using the cross point technique described with reference to FIG. 3. For example, a first selection voltage may be applied to the top pillar access line 435 and a second selection voltage may be applied the bottom pillar access line 435, as illustrated at the left side of FIG. 4. The pillar access lines 435 may represent pillar access lines 325 described with reference to FIG. 3, such as the pillar access column line 325-*a* and the pillar access row line 325-*b*, respectively. In some examples, the first selection voltage applied to the top pillar access line 435 and the second selection voltage applied to the bottom pillar access line 435 may have a same voltage value with different polarities (e.g., positive and negative polarities, respectively). In some cases, other voltage combinations or values may be possible without departing from the scope of the present disclosure (e.g., not limited to same voltage values and different polarities).

As described herein, the polarities of the first and second selection voltages may not change throughout the access operation 400. For example, in a positive access operation, voltage of positive polarity may be applied to the top pillar access line 435 and voltage of negative polarity may be applied to the bottom pillar access line 435. During the application of the first and second selection voltages, the voltages applied to the pillar 425 and to word lines 415 may be a constant voltage, such as zero voltage or a ground voltage (e.g., a virtual ground voltage).

Figure 7:
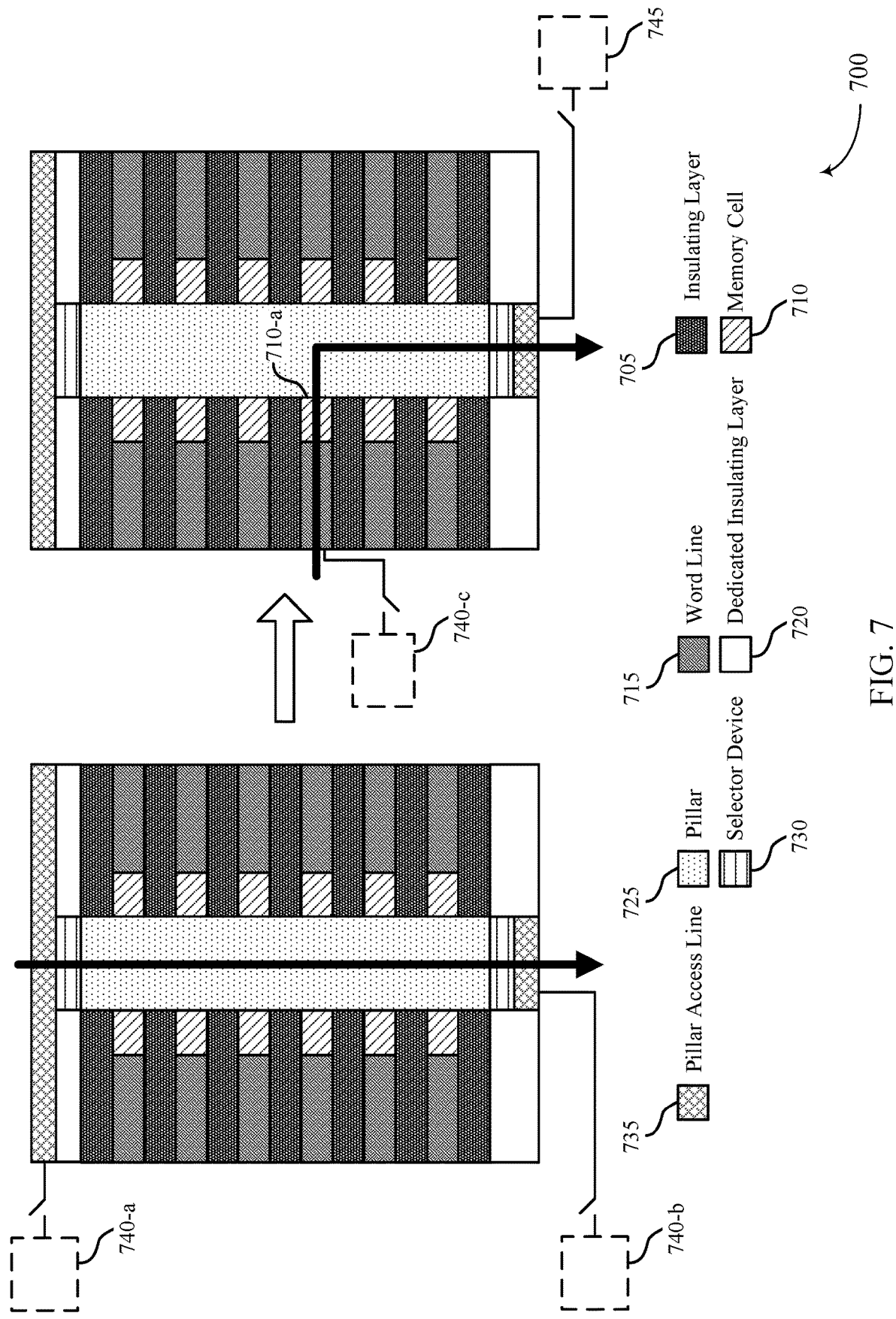
FIG. 7 illustrates an example of an access operation that supports a cross-point pillar architecture for memory arrays in accordance with examples as disclosed herein.

The first and second selection voltages may be applied, through each respective pillar access line 435, to the corresponding selector device 430 coupled to the respective pillar access lines 435. Based on the applied voltage, the selector devices 430 may be activated and may select the pillar 425 coupled to the selector devices 430. For positive access operations (e.g., positive programming and/or positive read operations), the first selection voltage applied to the top pillar access line 435 may have a positive polarity and the second selection voltage applied to the bottom pillar access line 435 may have a negative polarity of similar or same magnitude. When the second selection voltage is applied to the bottom pillar access line 435, a current mirror 440-a couplable with the bottom pillar access line 435 (e.g., via a switching component) may be activated and may be coupled with the bottom pillar access line 435. In some cases, the current mirror 440-a may be shared by the top and bottom pillar access lines 435, or may be couplable with either pillar access line 435. In some cases (e.g., as shown in FIG. 7), each pillar access line 435 may be couplable with a respective current mirror 440 (e.g., via a switching component).

The current mirror 440-a may be activated when the second selection voltage is applied to the bottom pillar access line 435. The current mirror 440-a may be activated to limit a current generated on the bottom pillar access line 435. For example, due to a low combined resistance of the pillar 425 and the selector devices 430 (e.g., when the selector devices are activated based on the applied selection voltages), the current on the bottom pillar access line 435 may be too high for operation without activating the current mirror 440-a (e.g., may damage or otherwise overload one or more components if the current mirror 440-a is not activated). Therefore, the current mirror 440-a may be referred to as limiting the current or absorbs a snapback voltage produced based on applying the first and second selection voltages.

In some cases, the pillar access lines 435 may also apply the first or second selection voltage to one or more selector devices 430 of adjacent, unselected pillars 425. For example, in some implementations, the selector device(s) 430 of one or more adjacent, unselected pillars 425 (e.g., grounded or floating pillar(s) 425) on a same pillar access line 435 may snap or turn on as a result of an applied selection voltage. In some cases, because both pillar access lines 435 may not be activated for the unselected pillars 425 (e.g., a top or bottom pillar access line 435 may not be activated), the unselected pillars 425 may not have a path for current flow and may therefore not be selected.

For example, if a selector device 430 of an unselected pillar 425 were turned on, it may polarize the associated pillar to a voltage, such as the selection voltage applied to the pillar access line 435 minus a voltage drop across the selector device 430 (e.g., an activation or snapback voltage, a voltage to maintain the selector device 430 active). In such cases, the one activated selector device 430 may shut off (e.g., after a time period) because there may be no current path, or sufficient voltage difference, between the two selector devices 430 coupled with the unselected pillar 425 (e.g., coupled in series with the pillar 425). Because a voltage is applied to the unselected pillar 425, there may be a voltage difference between the unselected pillar 425 and the word lines 415 associated with the pillar 425. In such cases, if the word lines 415 are grounded (e.g., to 0 volts (V)), the memory material of the memory cells 410 associated with the unselected pillar 425 may be configured to sustain a voltage drop or difference between the unselected pillar 425 and the associated word lines 415 without being programmed.

For example (e.g., if the word lines 415 are grounded), the memory cells 410 may be configured to withstand a voltage difference of the selection voltage applied to the pillar access line 435 minus a voltage drop across the selector device 430. In one example, the selection voltage may be 5.5 V and the voltage drop across the selector device 430 may be 1.5 V, and the word lines 415 may be floating or at 0 V, such that the memory cells 410 may be configured to withstand a voltage difference of 4 V (e.g., at least 4 V, more than 4 V) without being programmed.

After, or as a result of, applying the selection voltages to the pillar access lines 435, a second voltage may be applied to the selected pillar 425 to access a desired memory cell 410 (e.g., a memory cell 410-a), as illustrated at the right side of FIG. 4. The second voltage may be applied to the pillar 425 via the top pillar access line 435 and the top selector device 430 (e.g., which may snap or be activated based on application of the selection voltages). The second voltage may be the same or a lower value as the first selection voltage applied to the top pillar access line 435 and may be applied as a result of the activation of the top selector device 430. The second voltage at the pillar 425 may be less than a voltage applied to the top pillar access line 435 due to the voltage drop (e.g., Von) across the top selector device 430. Similarly, after the top and bottom selector devices 430 are activated, the current mirror 440-a (e.g., coupled with the bottom pillar access line 435) may be deactivated. Deactivating the current mirror 440-a may reduce a voltage of the bottom pillar access line 435 to a lower voltage value, such as a ground voltage (e.g., 0 V) or another voltage. In some cases, the bottom selector device 430) (e.g., an unused selector device 430) may be deactivated based on deactivation of the current mirror 440-a and the corresponding drop in voltage on the bottom pillar access line 435.

A first voltage may be applied to the word line 415 coupled to the desired memory cell 410 (e.g., a memory cell 410 to be accessed). The first voltage may be applied after or concurrently with the second voltage, and may be opposite in polarity to that of the second voltage (e.g., may have a negative polarity for a positive programming operation). Based on applying the first voltage and the second voltage, a voltage difference may develop across the memory cell 410, which may access the memory cell 410 (e.g., for a read operation or a programming operation). In some cases, a current mirror 440-b may be selectively coupled to the word line 415 for application of the first voltage (e.g., to limit a current generated on the word line 415).

By applying a voltage difference across the desired memory cell 410 (e.g., based on the voltages applied to the pillar 425 and the word line 415), a current flow may change paths as illustrated at the right of FIG. 4. For example, as depicted at the left of FIG. 4, during pillar selection (e.g., the application of the selection voltages), the current may flow from the top pillar access line 435, through the top selector device 430, through the pillar 425, through the bottom selector device 430, and to the bottom pillar access line 435. During memory cell selection (e.g., the application of the first voltage and second voltage), the current may flow from the top pillar access line 435, through the top selector device 430, through a portion of the pillar 425, through the memory cell 410, and to the activated word line 415 (e.g., exiting through the activated word line 415).

The voltage difference across the memory cell 410 may activate the memory cell for a read operation or a programming operation (e.g., write operation). For example, in a programming operation the state of the memory cell may be set to a positive value (e.g., may be programmed by a positive polarity voltage) based on a current flowing through the memory cell 410. After the memory cell access operation is completed (e.g., the memory cell 410 is read or programmed), the voltages applied to the pillar access lines 435 and the word line 415 may be removed.

In some cases, the access operation 400 may be used to complete a read operation. The read operation may be similar to a programming operation, using similar first and second selection voltages, but using lower first and second voltages (e.g., applied to the word line 415 and pillar 425, respectively), which may be referred to as read voltages. In the case of a read operation, the current mirror 440-a coupled with the bottom electrode may always be turned off after the selection voltages are applied, or turning off the current mirror 440-a may not be optional (e.g., and may be optional for a programming operation). After developing the voltages in the pillar 425 and the word line 415, a sense component 445 may be coupled with the top pillar access line 435 (e.g., via one or more switching components).

The sense component 445 may sense current in the top pillar access line 435 and the word line 415 to read a logic state of the memory cell 410. For example, if no current is flowing through the top pillar access line 435 and the word line 415, the memory cell 410 may be determined to store a first logic state (e.g., a logic '0') and if a current is flowing through the top pillar access line 435 and the word line 415, the memory cell 410 may be determined to store a second logic state (e.g., a logic '1'). In some cases, the sense component 445 may sense the current in the top pillar access line 435 and the word line 415 by comparing a current of the top pillar access line 435 and the word line 415 to a reference current.

Based on the applied voltages used for the access operation 400, the word lines 415 may be configured with bipolar decoding (e.g., with a word line decoder operable to apply voltages of different polarities) and the pillar access lines 435 may each be configured with unipolar decoding (e.g., with a respective decoder operable to apply voltages of one polarity). For example, the word lines 415 may be configured with bipolar decoding to support a voltage polarity configuration, such that either voltage polarity may be applied to the word lines 415. Because the voltage polarity applied to the word lines 415 may be positive or negative, the corresponding decoder may include two types of transistors (e.g., p-type and n-type transistors, such as positive metal oxide semiconductor (PMOS) and negative metal oxide semiconductor (NMOS), respectively), each configurable to apply either a positive or a negative voltage polarity. As such, the polarity of the voltage applied to the word lines 415 (e.g., applied to the transistors associated with the word line decoder) may determine the state of the programmed memory cell 410. The ability to apply voltages of either polarity to the word lines 415 may support removal or replacement of one or more relatively complex programming algorithms, which may lead to decreased energy consumption.

The pillar access lines 435 may be configured with respective unipolar decoding for applying a voltage of one polarity (e.g., positive for the case of positive programming) to the top pillar access line 435 and for applying a voltage of a different polarity (e.g., negative for the case of positive programming) to the bottom pillar access line 435. As such a decoder associated with the top pillar access line 435 may be configured with one type of transistor (e.g., a p-type transistor, PMOS) and a decoder associated with the bottom pillar access line 435 may be configured with another type of transistor (e.g., an n-type transistor, NMOS). The pillar access lines 435 may be configured with unipolar decoding, for example, because each pillar access line 435 may be associated with one voltage polarity and may therefore be associated with one corresponding type of transistor.

Figure 5:
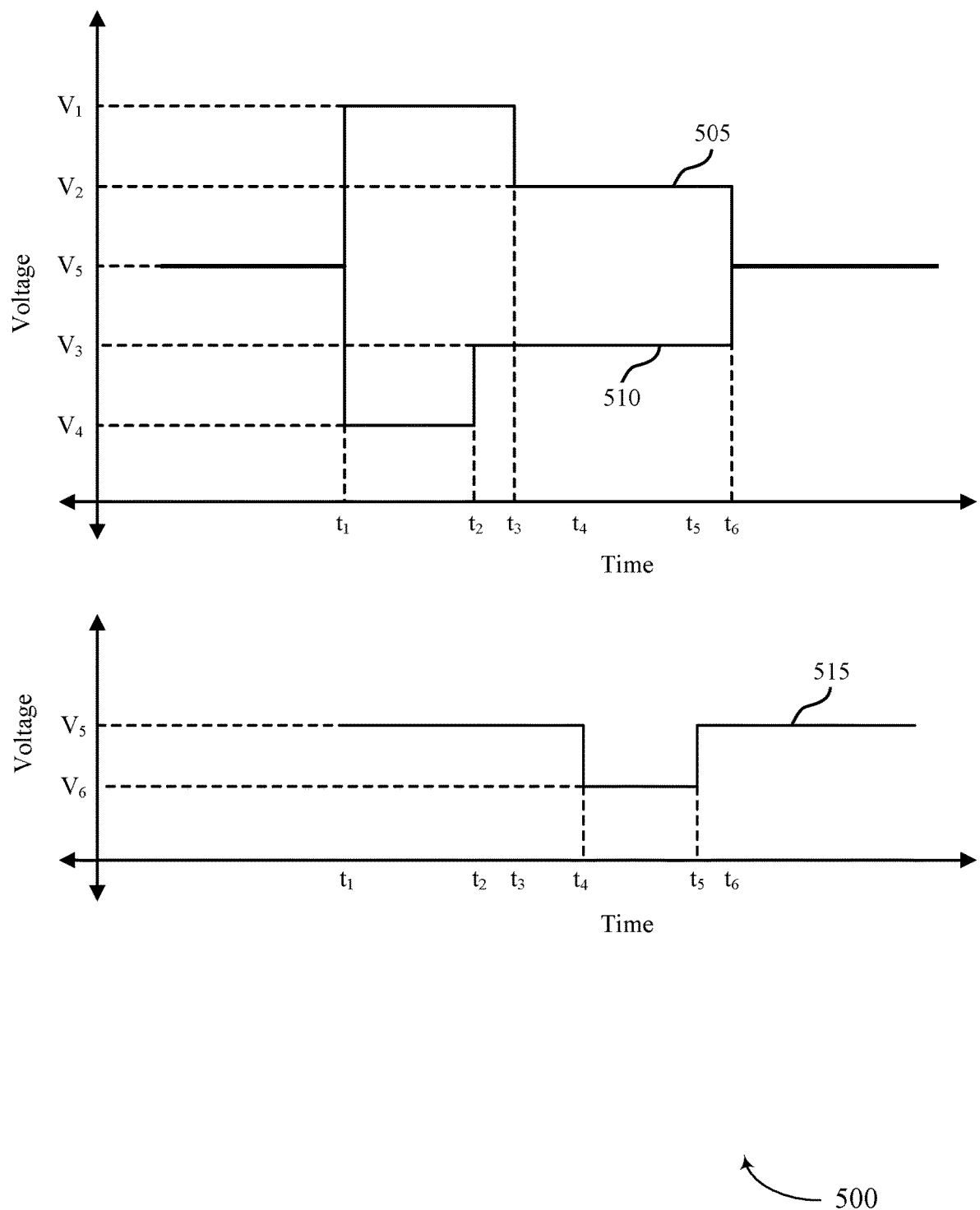
FIG. 5 illustrates an example of a timing diagram that supports a cross-point pillar architecture for memory arrays in accordance with examples as disclosed herein.

FIG. 5 illustrates an example of a timing diagram 500 that supports a cross-point pillar architecture for memory arrays in accordance with examples as disclosed herein. The voltages and timing described with reference to the timing diagram 500 may be applied during a positive programming operation as described in FIG. 4. For example, the timing diagram 500 may reference magnitudes, polarities, and timing of operations described with reference to FIG. 4. Similarly, components of a memory device described herein with reference to the timing diagram 500 may be the same or similar components as described with reference to FIG. 4. A voltage 505 of a top pillar access line and a voltage 510 of a bottom pillar access line as illustrated in FIG. 5 may be representative of a voltage of a top pillar access line and a bottom pillar access line, respectively, as described with reference to FIG. 4. A voltage 515 of a word line may be indicative of a voltage of a word line coupled with a memory cell to be programmed, as described with reference to FIG. 4. Although depicted at a same voltage value before $t_1$ and after $t_0$, voltage 505 and voltage 510 may begin at different voltages or a same voltage (e.g., a ground voltage value, such as 0 V).

At $t_1$, the top pillar access line and the bottom pillar access line may be activated. For example, voltage 505 (e.g., a voltage of the top pillar access line) may be raised from $V_5$ (e.g., a ground voltage or 0 V) to a first selection voltage or $V_1$. Similarly, voltage 510 (e.g., a voltage of the bottom pillar line) may be lowered from $V_5$ (e.g., a ground voltage or 0 V) to a second selection voltage or $V_4$. The voltage of $V_1$ may have a first polarity (e.g., a positive polarity) and the voltage of $V_4$ may have a second polarity (e.g., a negative polarity). The first and second selection voltages may be applied to the pillar access lines to activate or select a pillar at a junction of the two pillar access lines. Additionally, at $t_1$, a current mirror (e.g., as described with reference to FIG. 4) may be activated and coupled with the bottom pillar access line to prevent voltage snapback and an overload of current. In some examples, a magnitude of the selection voltages applied at $t_1$ (e.g., $V_1$ and $V_4$), may be equal to 5.5 V. At this time, voltage 515 (e.g., a word line voltage) may be at a ground voltage (e.g., $V_5$) or another inactivated voltage.

At $t_2$, the selector devices coupled with the pillar may undergo a snapback event based on application of the first and second selection voltages. For example, the selector devices coupled with the pillar may be activated (e.g., may "snap") based on the application of the first and second selection voltages and, in some cases, current may flow through the pillar (e.g., between the pillar access lines). At or after $t_2$, the memory device may deactivate and decouple the current mirror from the bottom pillar access line, as described with reference to FIG. 4. For example, deactivating the current mirror may be based on detecting the snapback event or based on a timer (e.g., based on an amount of time passing since application of the first and second selection voltages). Deactivating (e.g., decoupling) the current mirror may cause voltage 510 to drop or decrease in magnitude, such as from $V_4$ to a smaller negative voltage magnitude $V_3$. In some cases, deactivating the current mirror may result in the voltage 510 to decrease to a ground voltage (e.g., 0 V).

At $t_3$, in some examples, voltage 505 may decrease from $V_1$ to $V_2$, based on the snapback event and the selection or activation of the pillar (e.g., to decrease a possibility of selecting an unactivated pillar). For example, decreasing the voltage 505 applied to the top pillar access line may prevent unselected pillars and corresponding selector devices from turning on during the programming operation, as described with reference to FIG. 4. In some examples, the difference between $V_1$ and $V_2$ may be equal to 0.5 V. In some other examples, at $t_3$, the voltage 505 may remain at a same voltage value (e.g., $V_1$) after the snapback event. In some cases, the operations described at $t_2$ may occur prior, concurrently with, or after $t_3$. In some implementations, the voltage difference between voltages 505 and 510 at $t_3$ may be equal to a combined voltage drop across the selector devices of the pillar. In such cases, the bottom pillar access line may polarize to the voltage 505 minus the voltage drop across both selector devices.

At $t_4$, the voltage 515 may set to a programming voltage (e.g., −Vprog for positive programming or +Vprog for negative programming) based on the snapback event and selection of the pillar. For example, the voltage 515 may be lowered from $V_5$ (e.g., ground) to $V_6$ (e.g., −Vprog). In some cases, changing the voltage 515 (e.g., at $t_4$) may be based on detecting the snapback event or based on a timer (e.g., based on an amount of time passing since application of the first and second selection voltages). The programming voltage (e.g., $V_6$) may be applied to the word line and a current mirror may be activated and coupled with the word line (e.g., the programming voltage may be applied via the current mirror). Because the word line is coupled with the memory cell to be programmed, the programming voltage applied to the word line may be applied to one side of the memory cell. By setting voltage 515 to $V_6$ and voltage 505 to $V_2$ (e.g., or $V_1$) the memory device may set the memory cell to a desired state (e.g., by creating a voltage drop across the memory cell and running a current through the memory cell), which may be based on a polarity of the operation (e.g., may set the memory cell to a positive state in the positive programming operation). In some cases, the operations described at $t_3$ may occur prior, concurrently with, or after $t_3$ or $t_4$.

In some examples, a magnitude of the programming voltage, Vprog (e.g., $V_6$), may be in the range of 3 V to 4 V, and may be based on a magnitude of the pillar selection voltages applied to the pillar access lines and further based on the voltage drop across the selector device (e.g., the top selector device in the case of positive programming). In some implementations, the programming voltage may be based on a voltage margin for activating the unselected pillars (e.g., to avoid activating the unselected pillars). In some examples, the voltage across the memory cell may be 3.5 V when $V_6$ and $V_2$ (e.g., or $V_1$) are applied. For example, a total programming voltage (e.g., a voltage across the memory cell) may be equal to the voltage 505 applied to the pillar access line minus the voltage drop across the selector device, plus the programming voltage (e.g., Vprog).

In some examples, the voltage drop across the selector device may be equal to 1.5 V. In some cases, the voltage drop across the selector device may depend on a cross sectional area of the selector device (e.g., instead of based on the selector device thickness). The voltages 505 and 510 may be selectively controlled independently from the voltage drop across the selector device. In some cases, the voltage applied to the pillar via the top pillar access line may be equal to a difference between a voltage applied to the top pillar access line and the voltage drop across the selector device.

At $t_5$, the voltage 515 may be returned from $V_6$ to $V_5$ upon completing programming of the memory cell. For example, the word line may be deactivated and the voltage 515 may return to a ground voltage (e.g., a virtual ground).

At $t_0$, the pillar access lines may be deactivated upon completing the memory programming operation. For example, voltages 505 and 510 may return to a ground voltage or other voltage upon completing the memory programming operation. In some cases, the operations described at to may occur prior to, concurrently with, or after $t_5$.

Figure 6:
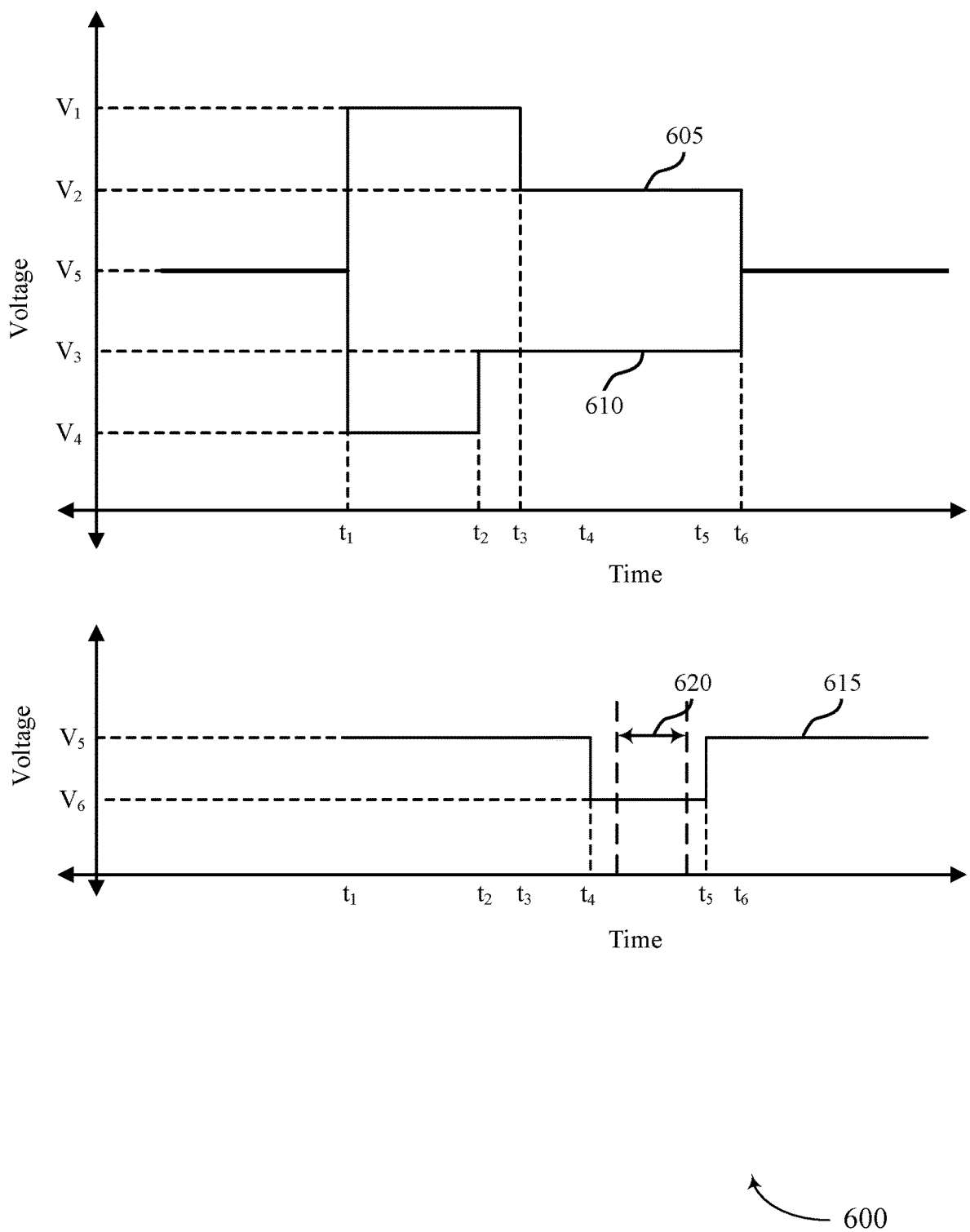
FIG. 6 illustrates an example of a timing diagram that supports a cross-point pillar architecture for memory arrays in accordance with examples as disclosed herein.

FIG. 6 illustrates an example of a timing diagram 600 that supports a cross-point pillar architecture for memory arrays in accordance with examples as disclosed herein. The voltages and timing described with reference to the timing diagram 600 may be applied during a positive read operation as described with reference to FIG. 4. For example, the timing diagram 600 may reference magnitudes, polarities, and timing of operations described with reference to FIG. 4. Similarly, components of a memory device described herein with reference to the timing diagram 600 listed herein may be the same or similar components as described with reference to FIG. 4. A voltage 605 of a top pillar access line and a voltage 610 of a bottom pillar access line as illustrated in FIG. 6 may be representative of a voltage of a top pillar access line and a bottom pillar access line, respectively, as described with reference to FIG. 4. A voltage 615 of a word line may be indicative of a voltage of a word line coupled with a memory cell to be read, as described with reference to FIG. 4. Although depicted at a same voltage value before $t_1$ and after $t_0$, voltage 605 and voltage 610 may begin at different voltages or a same voltage (e.g., a ground voltage value, such as (V).

At $t_1$, the top pillar access line and the bottom pillar access line may be activated. For example, voltage 605 (e.g., a voltage of the top pillar access line) may be raised from $V_5$ (e.g., a ground voltage or (V) to a first selection voltage or $V_1$. Similarly, voltage 610 (e.g., a voltage of the bottom pillar line) may be lowered from $V_5$ (e.g., a ground voltage or (V) to a second selection voltage or $V_4$. The voltage of $V_1$ may have a first polarity (e.g., a positive polarity) and the voltage of $V_4$ may have a second polarity (e.g., a negative polarity). The first and second selection voltages may be applied to the pillar access lines to activate or select a pillar at a junction of the two pillar access lines. In some cases, $V_1$ and $V_4$ may be the same or similar to voltages $V_1$ and $V_4$ described with reference to FIG. 5. Additionally, at $t_1$, a current mirror (e.g., as described with reference to FIG. 4) may be activated and coupled with the bottom pillar access line to prevent voltage snapback and an overload of current. In some examples, a magnitude of the selection voltages applied at $t_1$ (e.g., $V_1$ and $V_4$), may be equal to 5.5 V. At this time, voltage 515 (e.g., a word line voltage) may be at a ground voltage (e.g., $V_5$) or another inactivated voltage.

At $t_2$, the selector devices coupled with the pillar may undergo a snapback event based on application of the first and second selection voltages. For example, the selector devices coupled with the pillar may be activated (e.g., may "snap") based on the application of the first and second selection voltages and, in some cases, current may flow through the pillar (e.g., between the pillar access lines). At or after $t_2$, the memory device may deactivate and decouple the current mirror from the bottom pillar access line, as described with reference to FIG. 4. For example, deactivating the current mirror may be based on detecting the snapback event or based on a timer (e.g., based on an amount of time passing since application of the first and second selection voltages). Deactivating (e.g., decoupling) the current mirror may cause voltage 610 to drop or decrease in magnitude, such as from $V_4$ to a smaller negative voltage magnitude $V_3$. In some cases, deactivating the current mirror may result in the voltage 610 to decrease to a ground voltage (e.g., 0 V).

At $t_3$, voltage 605 may decrease from $V_1$ to $V_2$, based on the snapback event and the selection or activation of the pillar (e.g., to decrease a possibility of selecting an unactivated pillar). For example, decreasing the voltage 605 applied to the top pillar access line may prevent unselected pillars and corresponding selector devices from turning on during the read operation, as described with reference to FIG. 4. In some examples, $V_2$ may be less than $V_2$ described with reference to FIG. 5, for example, in order to perform the read operation. In some examples, the difference between $V_1$ and $V_2$ may be equal to 1 V. In some cases, the operations described at $t_2$ may occur prior, concurrently with, or after $t_3$. In some implementations, the voltage difference between voltages 605 and 610 at $t_3$ may be equal to a combined voltage drop across the selector devices of the pillar. In such cases, the bottom pillar access line may polarize to the voltage 605 minus the voltage drop across both selector devices.

At $t_4$, the voltage 615 may set to a read voltage (e.g., −Vread for positive read or +Vread for negative read) based on the snapback event and selection of the pillar. For example, the voltage 615 may be lowered from $V_5$ (e.g., ground) to $V_6$ (e.g., −Vread). The read voltage (e.g., $V_6$) may be less than a programming voltage $V_6$ described with reference to FIG. 5. In some cases, changing the voltage 615 (e.g., at $t_4$) may be based on detecting the snapback event or based on a timer (e.g., based on an amount of time passing since application of the first and second selection voltages). The read voltage (e.g., $V_6$) may be applied to the word line and a current mirror may be activated and coupled with the word line (e.g., the read voltage may be applied via the current mirror). Because the word line is coupled with the memory cell to be programmed, the read voltage applied to the word line may be applied to one side of the memory cell. By setting voltage 615 to $V_6$ and voltage 605 to $V_2$ the memory device may read a logic state of the memory cell, for example, based on a voltage difference across the memory cell.

The magnitudes of $V_2$ and $V_6$ may be configured such that a voltage applied across the memory cell may be between respective distributions of positively and negatively programmed memory cells (e.g., between distributions of cells programmed to '1' and cells programmed to '0'). In some examples, a total read voltage (e.g., a voltage across the memory cell) may be equal to the voltage 605 applied to the pillar access line minus the voltage drop across the selector device, plus the read voltage (e.g., Vread).

A read window 620 may correspond to a time in which a sense component is activated (e.g., to sense a logic state of the memory cell), where the sense component may compare a current in the top pillar access line with a reference current. The read window 620 may overlap with all or some of the application of voltage $V_6$ to the word line and may, for example, begin at or after $t_4$ and terminate at or before $t_5$. In some cases, the operations described at $t_3$ may occur prior, concurrently with, or after $t_3$ or $t_4$.

In some examples, a magnitude of the read voltage, Vread (e.g., $V_6$), may be in the range of 2 V to 3 V. In some examples, the voltage across the memory cell may be 2.5 V when $V_6$ and $V_2$ are applied. In some examples, the voltage drop across the selector device may be equal to 1.5 V. The voltages 605 and 610 may be selectively controlled independently from the voltage drop across the selector device. In some cases, the voltage applied to the pillar via the top pillar access line may be equal to a difference between a voltage applied to the top pillar access line and the voltage drop across the selector device.

At $t_5$, the voltage 615 may be returned from $V_6$ to $V_5$ upon completing reading of the memory cell. For example, the word line may be deactivated and the voltage 615 may return to a ground voltage (e.g., a virtual ground).

At $t_0$, the pillar access lines may be deactivated upon completing the memory read operation. For example, voltages 605 and 610 may return to a ground voltage or other voltage upon completing the memory read operation. In some cases, the operations described at to may occur prior to, concurrently with, or after $t_5$.

FIG. 7 illustrates an example of an access operation 700 that supports a cross-point pillar architecture for memory arrays in accordance with examples as disclosed herein. The access operation 700 may illustrate an example of a negative programming operation or a negative read operation, among other examples. The access operation 700 may represent an operation that performs pillar selection or activation to access an associated memory cell 710 using two selector devices 730, a pillar 725, and a word line 715, which components may represent examples of a memory cell, selector devices, a pillar, and a word line as described with reference to FIGS. 3 and 4. The pillar architecture depicted in access operation 700 may be a cross-section side view of a pillar 725, such as with respect to memory array 300.

The pillar 725 may be coupled with two selector devices 730, which may each be coupled with a respective pillar access line 735. The pillar access lines 735 may be insulated or electrically isolated from other pillar access lines 735 by a dedicated insulating layer 720. Multiple memory cells 710 may be coupled with the pillar 725, and each memory cell 710 may be coupled with a respective word line 715. Word lines 715 and memory cells 710 may be stacked on top of each other in different layers, which layers may be electrically isolated or insulated from each other by intervening insulating layers 705.

A pillar 725 may be selected or activated by applying a respective selection voltage to each selector device 730 coupled with the pillar 725 (e.g., via pillar access lines 735), for example, using the cross point technique described with reference to FIGS. 3 and 4. For example, a first selection voltage may be applied to the bottom pillar access line 735 and a second selection voltage may be applied the top pillar access line 735, as illustrated at the left side of FIG. 7. The pillar access lines 735 may represent pillar access lines 325 described with reference to FIG. 3, such as the pillar access column line 325-*a* and the pillar access row line 325-*b*, respectively. In some examples, the first selection voltage applied to the bottom pillar access line 735 and the second selection voltage applied to the top pillar access line 735 may have a same voltage value with different polarities (e.g., negative and positive polarities, respectively). In some cases, other voltage combinations or values may be possible without departing from the scope of the present disclosure (e.g., not limited to same voltage values and different polarities).

As described herein, the polarities of the first and second selection voltages may not change throughout the access operation 700. For example, in a negative access operation, voltage of positive polarity may be applied to the top pillar access line 735 and voltage of negative polarity may be applied to the bottom pillar access line 735. During the application of the first and second selection voltages, the voltages applied to the pillar 725 and to word lines 715 may be a constant voltage, such as zero voltage or a ground voltage (e.g., a virtual ground voltage).

The first and second selection voltages may be applied, through each respective pillar access line 735, to the corresponding selector device 730 coupled to the respective pillar access lines 735. Based on the applied voltage, the selector devices 730 may be activated and may select the pillar 725 coupled to the selector devices 730. For negative access operations (e.g., negative programming and/or negative read operations), the first selection voltage applied to the bottom pillar access line 735 may have a negative polarity and the second selection voltage applied to the top pillar access line 735 may have a positive polarity of similar or same magnitude. When the second selection voltage is applied to the top pillar access line 735, a current mirror 740-$a$ couplable with the top pillar access line 735 (e.g., via a switching component) may be activated and may be coupled with the top pillar access line 735. In some cases, a current mirror 740 may be shared by the top and bottom pillar access lines 735 (e.g., as shown in FIG. 4), or may be couplable with either pillar access line 735. In some cases, each pillar access line 735 may be couplable with a respective current mirror 740 (e.g., via a switching component). For example, the top pillar access line 735 may be couplable with current mirror 740-$a$ and the bottom pillar access lines 735 may be couplable with a current mirror 740-$b$.

The current mirror 740-$a$ may be activated when the second selection voltage is applied to the top pillar access line 735. The current mirror 740-$a$ may be activated to limit a current generated on the top pillar access line 735. For example, due to a low combined resistance of the pillar 725 and the selector devices 730 (e.g., when the selector devices are activated based on the applied selection voltages), the current on the top pillar access line 735 may be too high for operation without activating the current mirror 740-$a$ (e.g., may damage or otherwise overload one or more components if the current mirror 740-$a$ is not activated). Therefore, the current mirror 740-$a$ may be referred to as limiting the current or absorbs a snapback voltage produced based on applying the first and second selection voltages.

After, or as a result of, applying the selection voltages to the pillar access lines 735, a second voltage may be applied to the selected pillar 725 to access a desired memory cell 710 (e.g., a memory cell 710-$a$), as illustrated at the right side of FIG. 7. The second voltage may be applied to the pillar 725 via the bottom pillar access line 735 and the bottom selector device 730 (e.g., which may snap or be activated based on application of the selection voltages). The second voltage (e.g., a negative voltage) may be the same or a lower magnitude as the first selection voltage applied to the bottom pillar access line 735 and may be applied as a result of the activation of the bottom selector device 730. The second voltage at the pillar 725 may be less than a voltage applied to the bottom pillar access line 735 due to the voltage drop (e.g., Von) across the bottom selector device 730. Similarly, after the top and bottom selector devices 730 are activated, the current mirror 740-$a$ (e.g., coupled with the top pillar access line 735) may be deactivated. Deactivating the current mirror 740-$a$ may reduce a voltage of the top pillar access line 735 to a lower voltage value, such as a ground voltage (e.g., 0 V) or another voltage. In some cases, the top selector device 730 (e.g., an unused selector device 730) may be deactivated based on deactivation of the current mirror 740-$a$ and the corresponding drop in voltage on the top pillar access line 735.

A first voltage may be applied to the word line 715 coupled to the desired memory cell 710 (e.g., a memory cell 710 to be accessed). The first voltage may be applied after or concurrently with the second voltage, and may be opposite in polarity to that of the second voltage (e.g., may have a positive polarity for a negative programming operation). Based on applying the first voltage and the second voltage, a voltage difference may develop across the memory cell 710, which may access the memory cell 710 (e.g., for a read operation or a programming operation). In some cases, a current mirror 740-$c$ may be selectively coupled to the word line 715 for application of the first voltage (e.g., to limit a current generated on the word line 715).

By applying a voltage difference across the desired memory cell 710 (e.g., based on the voltages applied to the pillar 725 and the word line 715), a current flow may change paths as illustrated at the right of FIG. 7. For example, as depicted at the left of FIG. 7, during pillar selection (e.g., the application of the selection voltages), the current may flow from the top pillar access line 735, through the top selector device 730, through the pillar 725, through the bottom selector device 730, and to the bottom pillar access line 735. During memory cell selection (e.g., the application of the first voltage and second voltage), the current may flow from the activated word line 715, through the memory cell 710, through a portion of the pillar 725, through the bottom selector device 730, and to the bottom pillar access line 735 (e.g., exiting through the bottom pillar access line 735).

The voltage difference across the memory cell 710 may activate the memory cell 710 for a read operation or a programming operation (e.g., write operation). For example, in a programming operation the state of the memory cell may be set to a negative value (e.g., may be programmed by a negative polarity voltage) based on a current flowing through the memory cell 710. After the memory cell access operation is completed (e.g., the memory cell 710 is read or programmed), the voltages applied to the pillar access lines 735 and the word line 715 may be removed.

In some cases, the access operation 700 may be used to complete a read operation. The read operation may be similar to a programming operation, using similar first and second selection voltages, but using lower first and second voltages (e.g., applied to the word line 715 and pillar 725, respectively), which may be referred to as read voltages. In the case of a read operation, the current mirror 740-$a$ coupled with the top electrode may always be turned off after the selection voltages are applied, or turning off the current mirror 740-$a$ may not be optional (e.g., and may be optional for a programming operation). After developing the voltages in the pillar 725 and the word line 715, a sense component 745 may be coupled with the bottom pillar access line 735 (e.g., via one or more switching components).

The sense component 745 may sense current in the bottom pillar access line 735 and the word line 715 to read a logic state of the memory cell 710. For example, if no current is flowing through the bottom pillar access line 735 and the word line 715, the memory cell 710 may be determined to store a first logic state (e.g., a logic '0') and if a current is flowing through the bottom pillar access line 735 and the word line 715, the memory cell 710 may be determined to store a second logic state (e.g., a logic '1'). In some cases, the sense component 745 may sense the current in the bottom pillar access line 735 and the word line 715 by comparing a current of the bottom pillar access line 735 and the word line 715 to a reference current.

As described with reference to FIG. 4, a bipolar decoding scheme (e.g., a bipolar decoder) may be used for applying voltages to the word lines 715 (e.g., because a positive or a negative voltage may be applied to each word line 715, depending on whether a positive or negative access operation is performed on an associated memory cell 710). Similarly, respective unipolar decoding schemes may be used for applying voltages to each pillar access line 735 (e.g., because one, respective voltage polarity may be applied to a given pillar access line 735).

Additionally, as described with reference to FIG. 4, one or more pillars 725 that share a top or bottom pillar access line 735 may have one corresponding selector device 730 activated by the selection voltages applied to the top and bottom pillar access lines 735. As described with reference to FIG. 4, the activated selector device 730 may (e.g., after a time period) deactivate because there is no current path or there is an insufficient voltage difference across the selector device 730. Similarly, the memory cells 710 may be configured to withstand or support a voltage difference based on a voltage difference between a deactivated word line 715 (e.g., a grounded word line 715) and a pillar 725 with one selector device 730 activated (e.g., the pillar may be at the first or second selection voltage minus a voltage drop).

Figure 8:
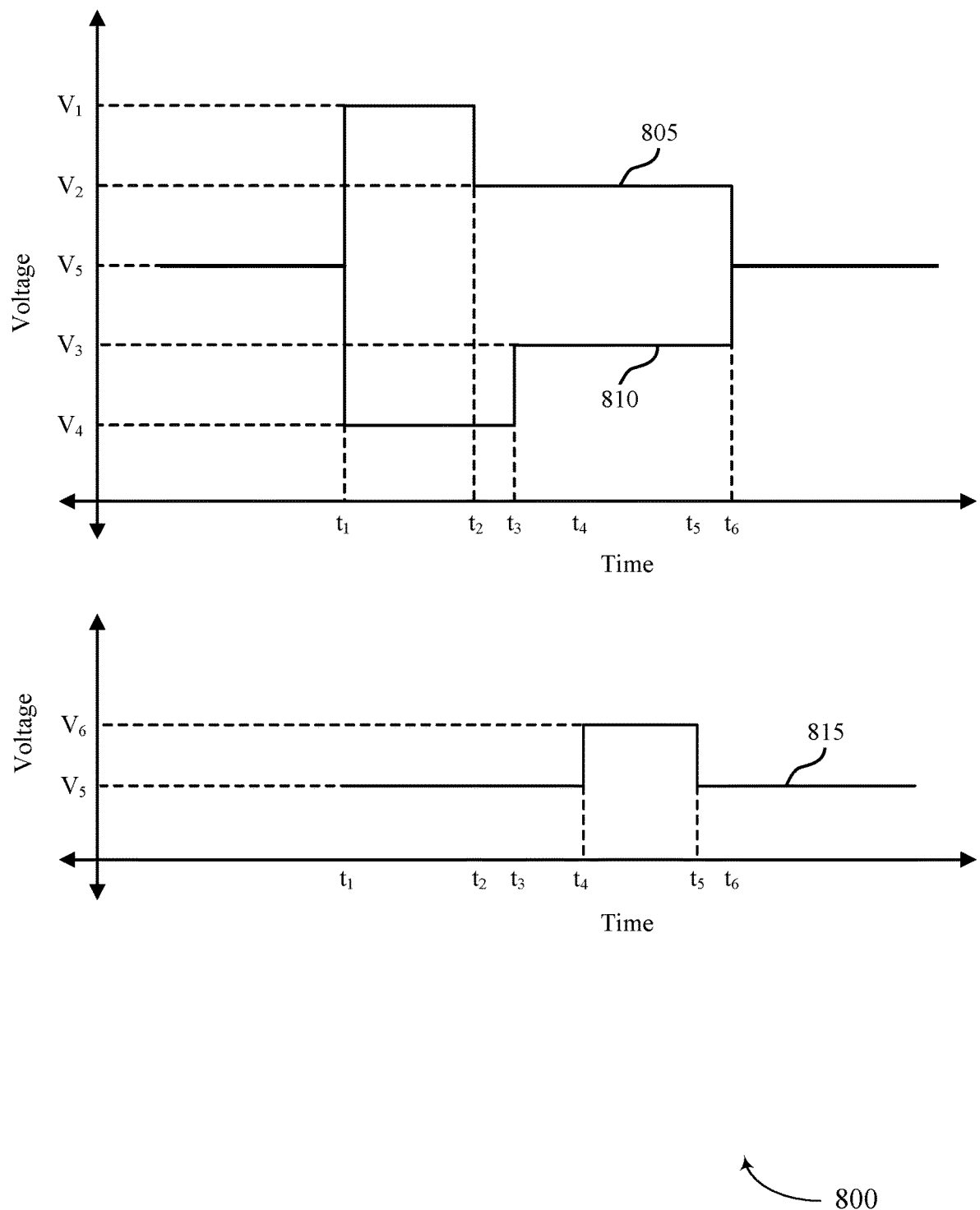
FIG. 8 illustrates an example of a timing diagram that supports a cross-point pillar architecture for memory arrays in accordance with examples as disclosed herein.

FIG. 8 illustrates an example of a timing diagram 800 that supports a cross-point pillar architecture for memory arrays in accordance with examples as disclosed herein. The voltages and timing described with reference to the timing diagram 800 may be applied during a negative programming operation as described in FIG. 7. For example, the timing diagram 800 may reference magnitudes, polarities, and timing of operations described with reference to FIG. 7. Similarly, components of a memory device described herein with reference to the timing diagram 800 may be the same or similar components as described with reference to FIG. 7. The voltage timing diagram may reference magnitudes, polarities, and timing of operations performed in FIG. 7. A voltage 805 of a top pillar access line and a voltage 810 of a bottom pillar access line as illustrated in FIG. 8 may be representative of a voltage of a top pillar access line and a bottom pillar access line, respectively, as described with reference to FIG. 7. A voltage 815 of a word line may be indicative of a voltage of a word line coupled with a memory cell to be programmed, as described with reference to FIG. 7. Although depicted at a same voltage value before $t_1$ and after $t_0$, voltage 805 and voltage 810 may begin at different voltages or a same voltage (e.g., a ground voltage value, such as 0) V).

At $t_1$, the top pillar access line and the bottom pillar access line may be activated. For example, voltage 805 (e.g., a voltage of the top pillar access line) may be raised from $V_5$ (e.g., a ground voltage or 0 V) to a second selection voltage or $V_1$. Similarly, voltage 810 (e.g., a voltage of the bottom pillar line) may be lowered from $V_5$ (e.g., a ground voltage or 0) V) to a first selection voltage or $V_4$. The voltage of $V_1$ may have a first polarity (e.g., a positive polarity) and the voltage of $V_4$ may have a second polarity (e.g., a negative polarity). The first and second selection voltages may be applied to the pillar access lines to activate or select a pillar at a junction of the two pillar access lines. Additionally, at $t_1$, a current mirror (e.g., as described with reference to FIG. 7) may be activated and coupled with the top pillar access line to prevent voltage snapback and an overload of current. In some examples, a magnitude of the selection voltages applied at $t_1$ (e.g., $V_1$ and $V_4$), may be equal to 5.5 V. At this time, voltage 815 (e.g., a word line voltage) may be at a ground voltage (e.g., $V_5$) or another inactivated voltage.

At $t_2$, the selector devices coupled with the pillar may undergo a snapback event based on application of the first and second selection voltages. For example, the selector devices coupled with the pillar may be activated (e.g., may "snap") based on the application of the first and second selection voltages and, in some cases, current may flow through the pillar (e.g., between the pillar access lines). At or after $t_2$, the memory device may deactivate and decouple the current mirror from the top pillar access line, as described with reference to FIG. 7. For example, deactivating the current mirror may be based on detecting the snapback event or based on a timer (e.g., based on an amount of time passing since application of the first and second selection voltages). Deactivating (e.g., decoupling) the current mirror may cause voltage 805 to drop or decrease in magnitude, such as from $V_1$ to $V_2$. In some cases, deactivating the current mirror may result in the voltage 805 to decrease to a ground voltage (e.g., 0 V).

At $t_3$, in some examples, voltage 810 may decrease in magnitude from $V_4$ to $V_3$ (e.g., while remaining a negative voltage), based on the snapback event and the selection or activation of the pillar (e.g., to decrease a possibility of selecting an unactivated pillar). For example, decreasing the voltage 810 applied to the bottom pillar access line may prevent unselected pillars and corresponding selector devices from turning on during the programming operation, as described with reference to FIG. 4. In some examples, the difference between $V_4$ and $V_3$ may be equal to 0.5 V. In some other examples, at $t_3$, the voltage 805 may remain at a same voltage value (e.g., $V_4$) after the snapback event. In some cases, the operations described at $t_2$ may occur prior, concurrently with, or after $t_3$. In some implementations, the voltage difference between voltages 805 and 810 at $t_3$ may be equal to a combined voltage drop across the selector devices of the pillar. In such cases, the top pillar access line may polarize to the voltage 810 plus the voltage drop across both selector devices.

At $t_4$, the voltage 815 may set to a programming voltage (e.g., −Vprog for positive programming or +Vprog for negative programming) based on the snapback event and selection of the pillar. For example, the voltage 815 may be raised from $V_5$ (e.g., ground) to $V_6$ (e.g., +Vprog). In some cases, changing the voltage 815 (e.g., at $t_4$) may be based on detecting the snapback event or based on a timer (e.g., based on an amount of time passing since application of the first and second selection voltages). The programming voltage (e.g., $V_6$) may be applied to the word line and a current mirror may be activated and coupled with the word line (e.g., the programming voltage may be applied via the current mirror). Because the word line is coupled with the memory cell to be programmed, the programming voltage applied to the word line may be applied to one side of the memory cell. By setting voltage 815 to $V_6$ and voltage 810 to $V_3$ (e.g., or $V_4$) the memory device may set the memory cell to a desired state (e.g., by creating a voltage drop across the memory cell and running a current through the memory cell), which may be based on a polarity of the operation (e.g., may set the memory cell to a negative state in the negative programming operation). In some cases, the operations described at $t_3$ may occur prior, concurrently with, or after $t_3$ or $t_4$.

In some examples, a magnitude of the programming voltage, Vprog (e.g., $V_6$), may be in the range of 3 V to 4 V, and may be based on a magnitude of the pillar selection voltages applied to the pillar access lines and further based on the voltage drop across the selector device (e.g., the top selector device in the case of positive programming). In some implementations, the programming voltage may be based on a voltage margin for activating the unselected pillars (e.g., to avoid activating the unselected pillars). In some examples, the voltage across the memory cell may be 3.5 V when $V_6$ and $V_3$ (e.g., or $V_4$) are applied. For example, a total programming voltage (e.g., a voltage across the memory cell) may be equal to the voltage 810 applied to the bottom pillar access line plus the voltage drop across the selector device, minus the programming voltage (e.g., Vprog).

In some examples, the voltage drop across the selector device may be equal to 1.5 V. In some cases, the voltage drop across the selector device may depend on a cross sectional area of the selector device (e.g., instead of based on the selector device thickness). The voltages 805 and 810 may be selectively controlled independently from the voltage drop across the selector device. In some cases, the voltage applied to the pillar via the bottom pillar access line may be equal to a difference between a voltage applied to the bottom pillar access line and the voltage drop across the selector device.

At $t_5$, the voltage 815 may be returned from $V_6$ to $V_5$ upon completing programming of the memory cell. For example, the word line may be deactivated and the voltage 815 may return to a ground voltage (e.g., a virtual ground).

At $t_0$, the pillar access lines may be deactivated upon completing the memory programming operation. For example, voltages 805 and 810 may return to a ground voltage or other voltage upon completing the memory programming operation. In some cases, the operations described at to may occur prior to, concurrently with, or after $t_5$.

Figure 9:
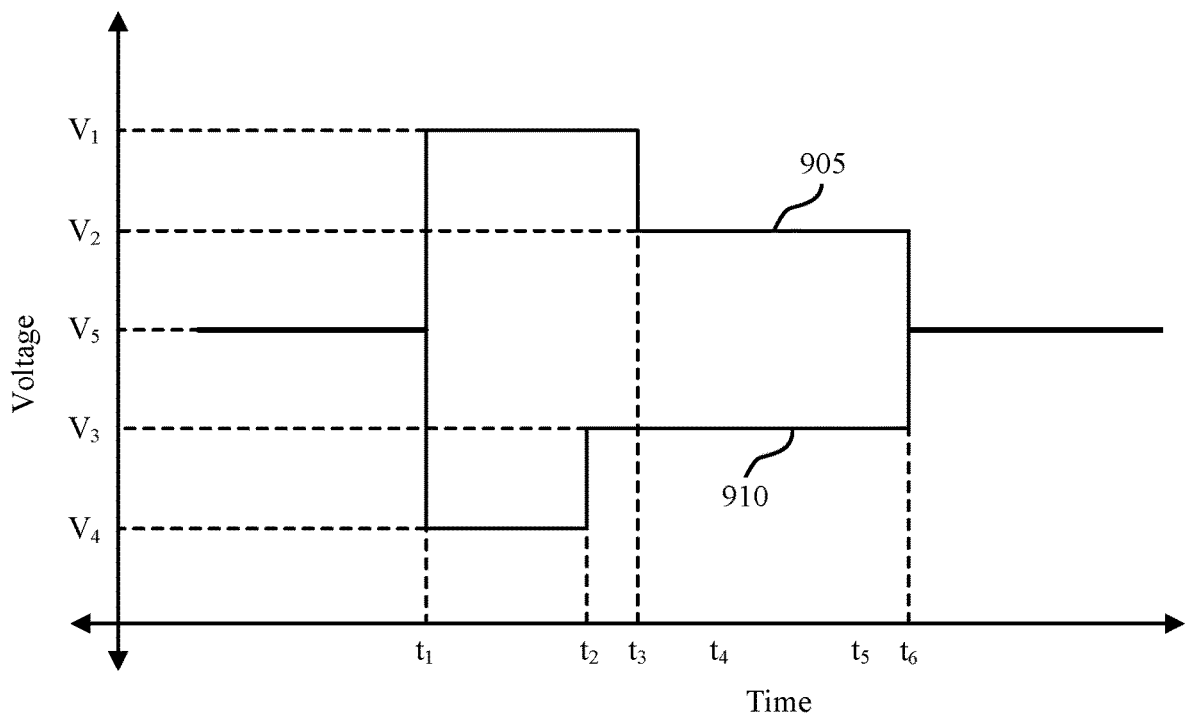
FIG. 9 illustrates an example of a timing diagram that supports a cross-point pillar architecture for memory arrays in accordance with examples as disclosed herein.
Figure 9:
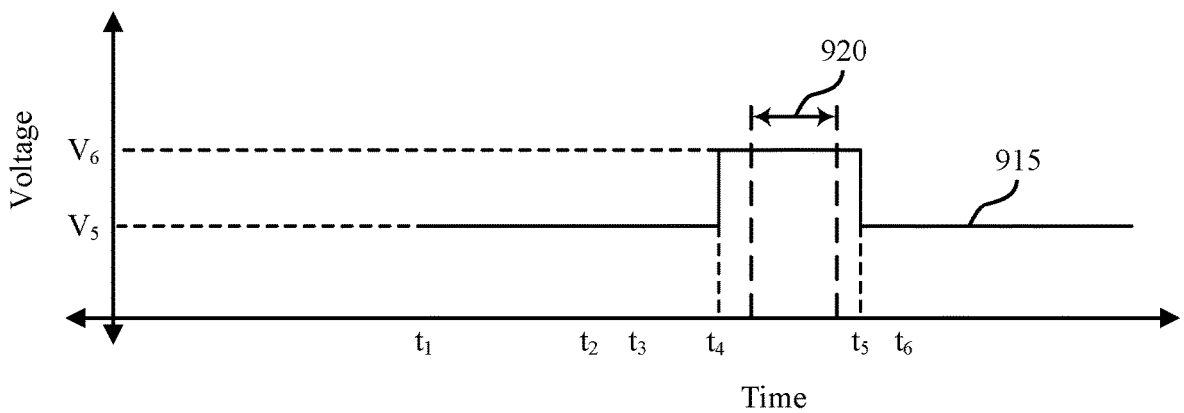

FIG. 9 illustrates an example of a timing diagram 900 that supports a cross-point pillar architecture for memory arrays in accordance with examples as disclosed herein. The voltages and timing described with reference to the timing diagram 900 may be applied during a negative read operation as described with reference to FIG. 7. For example, the timing diagram 900 may reference magnitudes, polarities, and timing of operations described with reference to FIG. 7. Similarly, components of a memory device described herein with reference to the timing diagram 900 listed herein may be the same or similar components as described with reference to FIG. 7. A voltage 905 of a top pillar access line and a voltage 910 of a bottom pillar access line as illustrated in FIG. 9 may be representative of a voltage of a top pillar access line and a bottom pillar access line, respectively, as described with reference to FIG. 7. A voltage 915 of a word line may be indicative of a voltage of a word line coupled with a memory cell to be read, as described with reference to FIG. 7. Although depicted at a same voltage value before $t_1$ and after $t_0$, voltage 905 and voltage 910 may begin at different voltages or a same voltage (e.g., a ground voltage value, such as 0 V).

At $t_1$, the top pillar access line and the bottom pillar access line may be activated. For example, voltage 905 (e.g., a voltage of the top pillar access line) may be raised from $V_5$ (e.g., a ground voltage or 0 V) to a second selection voltage or $V_1$. Similarly, voltage 910 (e.g., a voltage of the bottom pillar line) may be lowered from $V_5$ (e.g., a ground voltage or 0 V) to a first selection voltage or $V_4$. The voltage of $V_1$ may have a first polarity (e.g., a positive polarity) and the voltage of $V_4$ may have a second polarity (e.g., a negative polarity). The first and second selection voltages may be applied to the pillar access lines to activate or select a pillar at a junction of the two pillar access lines. In some cases, $V_1$ and $V_4$ may be the same or similar to voltages $V_1$ and $V_4$ described with reference to FIG. 8. Additionally, at $t_1$, a current mirror (e.g., as described with reference to FIG. 7) may be activated and coupled with the top pillar access line to prevent voltage snapback and an overload of current. In some examples, a magnitude of the selection voltages applied at $t_1$ (e.g., $V_1$ and $V_4$), may be equal to 5.5 V. At this time, voltage 815 (e.g., a word line voltage) may be at a ground voltage (e.g., $V_5$) or another inactivated voltage.

At $t_2$, the selector devices coupled with the pillar may undergo a snapback event based on application of the first and second selection voltages. For example, the selector devices coupled with the pillar may be activated (e.g., may "snap") based on the application of the first and second selection voltages and, in some cases, current may flow through the pillar (e.g., between the pillar access lines). At or after $t_2$, the memory device may deactivate and decouple the current mirror from the top pillar access line, as described with reference to FIG. 7. For example, deactivating the current mirror may be based on detecting the snapback event or based on a timer (e.g., based on an amount of time passing since application of the first and second selection voltages). Deactivating (e.g., decoupling) the current mirror may cause voltage 905 to drop or decrease in magnitude, such as from $V_1$ to $V_2$. In some cases, deactivating the current mirror may result in the voltage 905 to decrease to a ground voltage (e.g., 0 V).

At $t_3$, voltage 910 may decrease in magnitude from $V_4$ to $V_3$ (e.g., while still remaining a negative voltage), based on the snapback event and the selection or activation of the pillar (e.g., to decrease a possibility of selecting an unactivated pillar). For example, decreasing the voltage 910 applied to the bottom pillar access line may prevent unselected pillars and corresponding selector devices from turning on during the read operation, as described with reference to FIG. 4. In some examples, $V_3$ may be less than $V_3$ described with reference to FIG. 8, for example, in order to perform the read operation. In some examples, the difference between $V_4$ and $V_3$ may be equal to 1 V. In some cases, the operations described at $t_2$ may occur prior, concurrently with, or after $t_3$. In some implementations, the voltage difference between voltages 905 and 910 at $t_3$ may be equal to a combined voltage drop across the selector devices of the pillar. In such cases, the top pillar access line may polarize to the voltage 910 plus the voltage drop across both selector devices.

At $t_4$, the voltage 915 may set to a read voltage (e.g., −Vread for positive read or +Vread for negative read) based on the snapback event and selection of the pillar. For example, the voltage 915 may be raised from $V_5$ (e.g., ground) to $V_6$ (e.g., +Vread). The read voltage (e.g., $V_6$) may be less than a programming voltage $V_6$ described with reference to FIG. 8. In some cases, changing the voltage 915 (e.g., at $t_4$) may be based on detecting the snapback event or based on a timer (e.g., based on an amount of time passing since application of the first and second selection voltages). The read voltage (e.g., $V_6$) may be applied to the word line and a current mirror may be activated and coupled with the word line (e.g., the read voltage may be applied via the current mirror). Because the word line is coupled with the memory cell to be programmed, the read voltage applied to the word line may be applied to one side of the memory cell. By setting voltage 915 to $V_6$ and voltage 910 to $V_3$ the memory device may read a logic state of the memory cell, for example, based on a voltage difference across the memory cell.

The magnitudes of $V_3$ and $V_6$ may be configured such that a voltage applied across the memory cell may be between respective distributions of positively and negatively programmed memory cells (e.g., between distributions of cells programmed to '1' and cells programmed to '0'). In some examples, a total read voltage (e.g., a voltage across the memory cell) may be equal to the voltage 910 applied to the pillar access line plus the voltage drop across the selector device, minus the read voltage (e.g., Vread).

A read window 920 may correspond to a time in which a sense component is activated (e.g., to sense a logic state of the memory cell), where the sense component may compare a current in the bottom pillar access line with a reference current. The read window 920 may overlap with all or some of the application of voltage $V_6$ to the word line and may, for example, begin at or after ta and terminate at or before $t_5$. In some cases, the operations described at $t_3$ may occur prior, concurrently with, or after $t_3$ or $t_4$.

In some examples, a magnitude of the read voltage, Vread (e.g., $V_6$), may be in the range of 2 V to 3 V. In some examples, the voltage across the memory cell may be 2.5 V when $V_6$ and $V_3$ are applied. In some examples, the voltage drop across the selector device may be equal to 1.5 V. The voltages 905 and 910 may be selectively controlled independently from the voltage drop across the selector device. In some cases, the voltage applied to the pillar via the bottom pillar access line may be equal to a difference between a voltage applied to the bottom pillar access line and the voltage drop across the selector device.

At $t_5$, the voltage 915 may be returned from $V_6$ to $V_5$ upon completing reading of the memory cell. For example, the word line may be deactivated and the voltage 915 may return to a ground voltage (e.g., a virtual ground).

At $t_6$, the pillar access lines may be deactivated upon completing the memory read operation. For example, voltages 905 and 910 may return to a ground voltage or other voltage upon completing the memory read operation. In some cases, the operations described at to may occur prior to, concurrently with, or after $t_5$.

Figure 10:
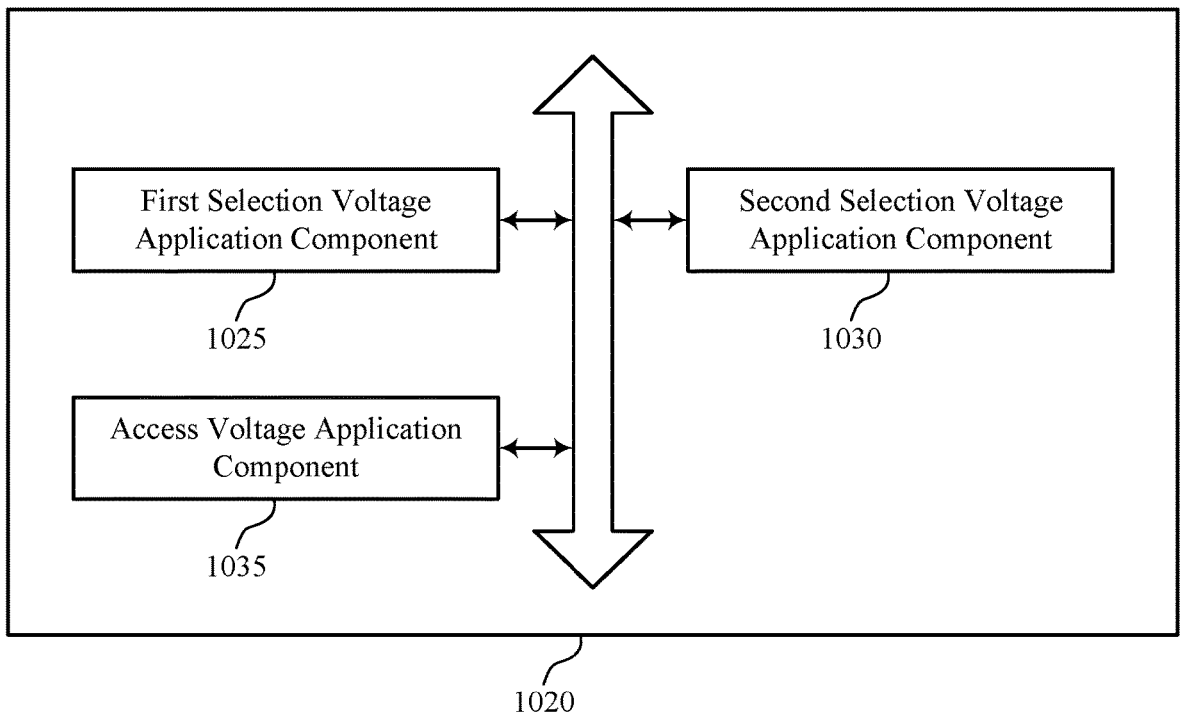
FIG. 10 shows a block diagram of a memory device that supports a cross-point pillar architecture for memory arrays in accordance with examples as disclosed herein.

FIG. 10 shows a block diagram 1000 of a memory device 1020 that supports a cross-point pillar architecture for memory arrays in accordance with examples as disclosed herein. The memory device 1020 may be an example of aspects of a memory device as described with reference to FIGS. 1 through 9. The memory device 1020, or various components thereof, may be an example of means for performing various aspects of cross-point pillar architecture for memory arrays as described herein. For example, the memory device 1020 may include a first selection voltage application component 1025, a second selection voltage application component 1030, an access voltage application component 1035, or any combination thereof. Each of these components may communicate, directly or indirectly, with one another (e.g., via one or more buses).

The first selection voltage application component 1025 may be configured as or otherwise support a means for applying a first selection voltage to a second electrode coupled with a first selector device, the first selector device coupled with a first end of a pillar. The second selection voltage application component 1030 may be configured as or otherwise support a means for applying a second selection voltage to a third electrode coupled with a second selector device, the second selector device coupled with a second end of the pillar, where a second voltage is applied to the pillar via the second electrode and the first selector device based at least in part on applying the first selection voltage to the second electrode and the second selection voltage to the third electrode. The access voltage application component 1035 may be configured as or otherwise support a means for applying a first voltage to a first electrode coupled with a memory material element after applying the first selection voltage to the second electrode and the second selection voltage to the third electrode, the memory material element coupled with the first electrode and the pillar, where the memory material element is accessed based at least in part on applying the first voltage to the first electrode and the second voltage to the pillar.

In some examples, the access voltage application component 1035 may be configured as or otherwise support a means for writing a logical value to the memory material element based at least in part on applying the first voltage to the first electrode and the second voltage to the pillar. In some examples, the logical value includes one of a first logical value or a second logical value based at least in part on a polarity of a voltage difference between the first voltage and the second voltage. In some examples, the access voltage application component 1035 may be configured as or otherwise support a means for reading a logical value from the memory material element based at least in part on applying the first voltage to the first electrode and the second voltage to the pillar.

In some examples, to support applying the second selection voltage to the third electrode, the second selection voltage application component 1030 may be configured as or otherwise support a means for applying the second selection voltage to the third electrode via a current mirror coupled with the third electrode. In some examples, the second selection voltage application component 1030 may be configured as or otherwise support a means for reducing the second selection voltage to a third selection voltage after applying the first voltage to the first electrode, where reducing the second selection voltage to the third selection voltage includes deactivating the current mirror.

In some examples, to support applying the first voltage to the first electrode, the access voltage application component 1035 may be configured as or otherwise support a means for applying the first voltage to the first electrode via a current mirror coupled with the first electrode.

In some examples, the first selection voltage application component 1025 may be configured as or otherwise support a means for reducing the first selection voltage to a fourth selection voltage after applying the first voltage to the first electrode, where applying the second voltage to the pillar is based at least in part on reducing the first selection voltage to the fourth selection voltage.

In some examples, the second selection voltage is lower than the first selection voltage and the first voltage is lower than the second voltage. In some examples, the first selection voltage is lower than the second selection voltage and the second voltage is lower than the first voltage.

In some examples, the pillar is coupled with a plurality of memory material elements that includes the memory material element, each memory material element of the plurality coupled with a respective first electrode. In some examples, the second voltage is based at least in part on a voltage drop across the first selector device.

Figure 11:
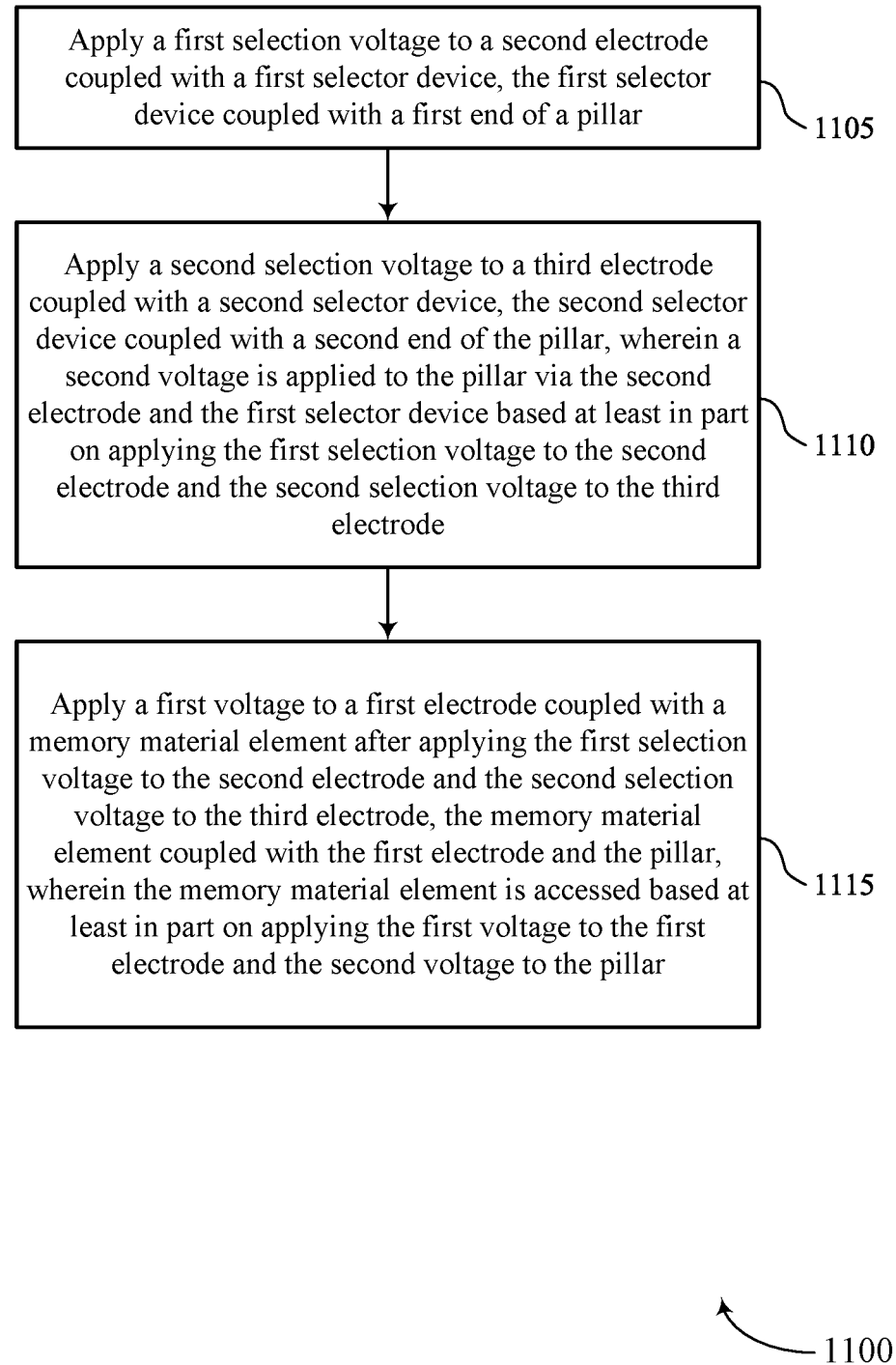
FIG. 11 shows a flowchart illustrating a method or methods that support a cross-point pillar architecture for memory arrays in accordance with examples as disclosed herein.

FIG. 11 shows a flowchart illustrating a method 1100 that supports a cross-point pillar architecture for memory arrays in accordance with examples as disclosed herein. The operations of method 1100 may be implemented by a memory device or its components as described herein. For example, the operations of method 1100 may be performed by a memory device as described with reference to FIGS. 1 through 10. In some examples, a memory device may execute a set of instructions to control the functional elements of the device to perform the described functions. Additionally or alternatively, the memory device may perform aspects of the described functions using special-purpose hardware.

At 1105, the method may include applying a first selection voltage to a second electrode coupled with a first selector device, the first selector device coupled with a first end of a pillar. The operations of 1105 may be performed in accordance with examples as disclosed herein. In some examples, aspects of the operations of 1105 may be performed by a first selection voltage application component 1025 as described with reference to FIG. 10.

At 1110, the method may include applying a second selection voltage to a third electrode coupled with a second selector device, the second selector device coupled with a second end of the pillar, where a second voltage is applied to the pillar via the second electrode and the first selector device based at least in part on applying the first selection voltage to the second electrode and the second selection voltage to the third electrode. The operations of 1110 may be performed in accordance with examples as disclosed herein. In some examples, aspects of the operations of 1110 may be performed by a second selection voltage application component 1030 as described with reference to FIG. 10.

At 1115, the method may include applying a first voltage to a first electrode coupled with a memory material element after applying the first selection voltage to the second electrode and the second selection voltage to the third electrode, the memory material element coupled with the first electrode and the pillar, where the memory material element is accessed based at least in part on applying the first voltage to the first electrode and the second voltage to the pillar. The operations of 1115 may be performed in accordance with examples as disclosed herein. In some examples, aspects of the operations of 1115 may be performed by an access voltage application component 1035 as described with reference to FIG. 10.

In some examples, an apparatus as described herein may perform a method or methods, such as the method 1100. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for applying a first selection voltage to a second electrode coupled with a first selector device, the first selector device coupled with a first end of a pillar; applying a second selection voltage to a third electrode coupled with a second selector device, the second selector device coupled with a second end of the pillar, where a second voltage is applied to the pillar via the second electrode and the first selector device based at least in part on applying the first selection voltage to the second electrode and the second selection voltage to the third electrode; and applying a first voltage to a first electrode coupled with a memory material element after applying the first selection voltage to the second electrode and the second selection voltage to the third electrode, the memory material element coupled with the first electrode and the pillar, where the memory material element is accessed based at least in part on applying the first voltage to the first electrode and the second voltage to the pillar.

Aspect 2: The method, apparatus, or non-transitory computer-readable medium of aspect 1, further including operations, features, circuitry, logic, means, or instructions, or any combination thereof for writing a logical value to the memory material element based at least in part on applying the first voltage to the first electrode and the second voltage to the pillar.

Aspect 3: The method, apparatus, or non-transitory computer-readable medium of aspect 2 where the logical value includes one of a first logical value or a second logical value based at least in part on a polarity of a voltage difference between the first voltage and the second voltage.

Aspect 4: The method, apparatus, or non-transitory computer-readable medium of any of aspects 1 through 3, further including operations, features, circuitry, logic, means, or instructions, or any combination thereof for reading a logical value from the memory material element based at least in part on applying the first voltage to the first electrode and the second voltage to the pillar.

Aspect 5: The method, apparatus, or non-transitory computer-readable medium of any of aspects 1 through 4 where operations, features, circuitry, logic, means, or instructions, or any combination thereof for applying the second selection voltage to the third electrode includes operations, features, circuitry, logic, means, or instructions, or any combination thereof for applying the second selection voltage to the third electrode via a current mirror coupled with the third electrode.

Aspect 6: The method, apparatus, or non-transitory computer-readable medium of aspect 5, further including operations, features, circuitry, logic, means, or instructions, or any combination thereof for reducing the second selection voltage to a third selection voltage after applying the first voltage to the first electrode, where reducing the second selection voltage to the third selection voltage includes deactivating the current mirror.

Aspect 7: The method, apparatus, or non-transitory computer-readable medium of any of aspects 1 through 6 where operations, features, circuitry, logic, means, or instructions, or any combination thereof for applying the first voltage to the first electrode includes operations, features, circuitry, logic, means, or instructions, or any combination thereof for applying the first voltage to the first electrode via a current mirror coupled with the first electrode.

Aspect 8: The method, apparatus, or non-transitory computer-readable medium of any of aspects 1 through 7, further including operations, features, circuitry, logic, means, or instructions, or any combination thereof for reducing the first selection voltage to a fourth selection voltage after applying the first voltage to the first electrode, where applying the second voltage to the pillar is based at least in part on reducing the first selection voltage to the fourth selection voltage.

Aspect 9: The method, apparatus, or non-transitory computer-readable medium of any of aspects 1 through 8 where the second selection voltage is lower than the first selection voltage and the first voltage is lower than the second voltage.

Aspect 10: The method, apparatus, or non-transitory computer-readable medium of any of aspects 1 through 9 where the first selection voltage is lower than the second selection voltage and the second voltage is lower than the first voltage.

Aspect 11: The method, apparatus, or non-transitory computer-readable medium of any of aspects 1 through 10 where the pillar is coupled with a plurality of memory material elements that includes the memory material element, each memory material element of the plurality coupled with a respective first electrode.

Aspect 12: The method, apparatus, or non-transitory computer-readable medium of any of aspects 1 through 11 where the second voltage is based at least in part on a voltage drop across the first selector device.

It should be noted that the methods described herein describe possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 13: An apparatus, including: a plurality of first layers each including a respective memory material element coupled with a respective first electrode: a pillar extending through the plurality of first layers and coupled with each of the respective memory material elements, where a memory material element of the respective memory material elements is operable to be accessed based at least in part on a voltage difference between the pillar and a first electrode coupled with the memory material element: a first selector device coupled with a first portion of the pillar that is above the plurality of first layers: a second selector device coupled with a second portion of the pillar that is below the plurality of first layers: a second electrode coupled with the first selector device and operable to apply a first selection voltage to the first selector device; and a third electrode coupled with the second selector device and operable to apply a second selection voltage to the second selector device.

Aspect 14: The apparatus of aspect 13, where the plurality of first layers each further include a respective second memory material element coupled with a respective first electrode for the respective second memory material element, the apparatus further including: a second pillar extending through the plurality of first layers and coupled with each of the respective second memory material elements, where a second memory material element of the respective second memory material elements is operable to be accessed based at least in part on a voltage difference between the second pillar and a first electrode coupled with the second memory material element: a third selector device coupled with the second electrode and coupled with a first portion of the second pillar that is above the plurality of first layers, the second electrode operable to apply the first selection voltage to the third selector device; a fourth selector device coupled with a second portion of the second pillar that is below the plurality of first layers; and a fourth electrode coupled with the fourth selector device and operable to apply the second selection voltage to the fourth selector device.

Aspect 15: The apparatus of any of aspects 13 through 14, where the plurality of first layers each further include a respective third memory material element coupled with a respective first electrode for the respective third memory material element, the apparatus further including: a third pillar extending through the plurality of first layers and coupled with each of the respective third memory material elements, where a third memory material element of the respective third memory material elements is operable to be accessed based at least in part on a voltage difference between the third pillar and a first electrode coupled with the third memory material element: a fifth selector device coupled with a first portion of the third pillar that is above the plurality of first layers: a sixth selector device coupled with the third electrode and coupled with a second portion of the third pillar that is below the plurality of first layers, the third electrode operable to apply the second selection voltage to the sixth selector device; and a fifth electrode coupled with the fifth selector device and operable to apply the first selection voltage to the fifth selector device.

Aspect 16: The apparatus of any of aspects 13 through 15, further including: a first current mirror couplable with the first electrode and operable to maintain a first current in the first electrode when the first current mirror is activated, the first current based at least in part on the voltage difference between the pillar and the first electrode: a second current mirror couplable with the second electrode and operable to maintain a second current in the second electrode when the second current mirror is activated, the second current based at least in part on the first selection voltage; and a third current mirror couplable with the third electrode and operable to maintain a third current in the third electrode when the third current mirror is activated, the third current based at least in part on the second selection voltage, where the second current mirror and the third current mirror include different current mirrors or a same current mirror.

Aspect 17: The apparatus of any of aspects 13 through 16, further including: a first unipolar decoder coupled with the second electrode and operable to apply voltages having a first polarity to the second electrode: a second unipolar decoder coupled with the third electrode and operable to apply voltages having a second polarity to the third electrode; and a bipolar decoder coupled with at least one of the first electrodes and operable to apply voltages having the first polarity or the second polarity to the first electrode.

Aspect 18: The apparatus of any of aspects 13 through 17, where the first selector device and the second selector device are operable to activate the pillar based at least in part on application of the first selection voltage and the second selection voltage.

Aspect 19: The apparatus of aspect 18, where the second electrode or the third electrode is operable to apply a second voltage to the pillar after the pillar is activated, and the voltage difference between the pillar and the first electrode coupled with the memory material element is based at least in part on the second voltage.

Aspect 20: The apparatus of any of aspects 18 through 19, where the first electrode coupled with the memory material element is operable to be biased at a first voltage after the pillar is activated, and the voltage difference between the pillar and the first electrode is based at least in part on the first voltage.

Aspect 21: The apparatus of any of aspects 13 through 20, where the first selector device and the second selector device each include a first chalcogenide material.

Aspect 22: The apparatus of aspect 21, where the respective memory material elements each include a second chalcogenide material.

An apparatus is described. The following provides an overview of aspects of the apparatus as described herein:

Aspect 23: An apparatus, including: a plurality of first layers each including a respective memory material element coupled with a respective first electrode: a pillar extending through the plurality of first layers and coupled with each of the respective memory material elements: a first selector device coupled with a first portion of the pillar; a second selector device coupled with a second portion of the pillar opposite the first selector device: a second electrode coupled with the first selector device: a third electrode coupled with the second selector device; and a controller operable to cause the apparatus to: apply a first selection voltage to the second electrode: apply a second selection voltage to the third electrode, where the pillar is operable to be biased at a second voltage via the second electrode and the first selector device based at least in part on applying the first selection voltage to the second electrode and the second selection voltage to the third electrode: and apply a first voltage to a first electrode of the respective first electrodes based at least in part on applying the first selection voltage to the second electrode and the second selection voltage to the third electrode, the first electrode coupled with a memory material element of the respective memory material elements, where the memory material element is operable to be accessed based at least in part on applying the first voltage to the first electrode and biasing the pillar to the second voltage.

Aspect 24: The apparatus of aspect 23, where the controller is further operable to cause the apparatus to: reduce the second selection voltage to a third selection voltage after applying the first voltage to the first electrode, where reducing the second selection voltage to the third selection voltage includes deactivating a current mirror couplable with the third electrode.

Aspect 25: The apparatus of any of aspects 23 through 24, where the controller is further operable to cause the apparatus to: reduce the first selection voltage to a fourth selection voltage after applying the first voltage to the first electrode, where applying the second voltage to the pillar is based at least in part on reducing the first selection voltage to the fourth selection voltage.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal: however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow:

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    applying a first selection voltage to a first access line and a second selection voltage to a second access line, wherein the first access line is coupled with a first end of a pillar, wherein the second access line is coupled with a second end of the pillar and a current mirror, and wherein the pillar is activated based at least in part on the first selection voltage and the second selection voltage;
    deactivating the current mirror based at least in part on activating the pillar, wherein deactivating the current mirror is associated with a decrease in a magnitude of a voltage on the second access line; and
    applying, after deactivating the current mirror, a programming voltage to a word line coupled with a memory material element, the memory material element coupled with the word line and the pillar, wherein a current through the memory material element flows from the first access line to the word line via a portion of the activated pillar based at least in part on applying the programming voltage to the word line and the decrease in the magnitude of the voltage of the second access line.

2. The method of claim 1, further comprising:
    decreasing a magnitude of the first selection voltage applied to the first access line after activating the pillar.

3. The method of claim 1, further comprising:
    activating a first selector device and a second selector device based at least in part on applying the first selection voltage and the second selection voltage, wherein the first selector device is coupled with the first access line and the first end of the pillar, and wherein the second selector device is coupled with the second access line and the second end of the pillar.

4. The method of claim 3, further comprising:
    deactivating the second selector device based at least in part on deactivating the current mirror, wherein the current through the memory material element is based at least in part on deactivating the second selector device.

5. The method of claim 3, further comprising:
detecting a snapback event based at least in part on activating the first selector device and the second selector device, wherein applying the programming voltage is based at least in part on detecting the snapback event.

6. The method of claim 1, wherein applying the programming voltage is based at least in part on an elapsed duration since applying the first selection voltage or the second selection voltage.

7. The method of claim 1, wherein the programming voltage is less than the first selection voltage, and wherein the memory material element is programmed to a first state based at least in part on applying the programming voltage.

8. The method of claim 1, wherein the programming voltage is greater than the first selection voltage, and wherein the memory material element is programmed to a second state based at least in part on applying the programming voltage.

9. The method of claim 1, further comprising:
coupling a second current mirror with the word line, wherein the programming voltage is applied based at least in part on the second current mirror being coupled with the word line.

10. The method of claim 1, further comprising:
ceasing to apply the first selection voltage based at least in part on completing programming of the memory material element;
ceasing to apply the second selection voltage based at least in part on completing programming of the memory material element; and
ceasing to apply the programming voltage based at least in part on completing programming of the memory material element.

11. A method, comprising:
applying a first selection voltage to a first access line and a second selection voltage to a second access line, wherein the first access line is coupled with a first end of a pillar, wherein the second access line is coupled with a second end of the pillar and a current mirror, and wherein the pillar is activated based at least in part on the first selection voltage and the second selection voltage;
deactivating the current mirror based at least in part on activating the pillar, wherein deactivating the current mirror is associated with a decrease in a magnitude of a voltage on the second access line;
applying, after deactivating the current mirror, a read voltage to a word line coupled with a memory material element, the memory material element coupled with the word line and the pillar; and
activating, based at least in part on applying the read voltage, a sense component to read a logic state associated with the memory material element, wherein the sense component measures a current through the memory material element, and wherein the current through the memory material element flows from the first access line to the word line via a portion of the activated pillar based at least in part on the decrease in the magnitude of the voltage on the second access line.

12. The method of claim 11, further comprising:
comparing the current through the memory material element with a threshold current, wherein reading the logic state associated with the memory material element is based at least in part on the comparing.

13. The method of claim 11, wherein activating the sense component comprises:
activating the sense component for a duration that at least partially overlaps with application of the read voltage.

14. The method of claim 11, further comprising:
decreasing, after activating the pillar, the first selection voltage applied to the first access line.

15. The method of claim 11, further comprising:
activating a first selector device and a second selector device based at least in part on applying the first selection voltage and the second selection voltage, wherein the first selector device is coupled with the first access line and the first end of the pillar, and wherein the second selector device is coupled with the second access line and the second end of the pillar.

16. The method of claim 15, further comprising:
deactivating the second selector device based at least in part on deactivating the current mirror, wherein the current through the memory material element is based at least in part on deactivating the second selector device.

17. The method of claim 15, further comprising:
detecting a snapback event based at least in part on activating the first selector device and the second selector device, wherein applying the read voltage is based at least in part on detecting the snapback event.

18. The method of claim 11, wherein the read voltage is less than the first selection voltage.

19. The method of claim 11, wherein the read voltage is greater than the first selection voltage.

20. An apparatus, comprising:
a first access line coupled with a first end of a pillar;
a second access line coupled with a second end of the pillar and a current mirror;
a memory material element coupled with a word line and the pillar; and
processing circuitry configured to cause the apparatus to:
apply a first selection voltage to the first access line and a second selection voltage to the second access line, wherein the pillar is configured to be activated based at least in part on the first selection voltage and the second selection voltage;
deactivate the current mirror based at least in part on activating the pillar, wherein a deactivation of the current mirror is associated with a decrease in a magnitude of a voltage of the second access line; and
apply, after the deactivation of the current mirror, a programming voltage to the word line, wherein application of the programming voltage to the word line and the decrease in the magnitude of the voltage of the second access line are configured to cause a current to flow through the memory material element from the first access line to the word line via a portion of the activated pillar.

* * * * *